United States Patent
Akiyama et al.

(10) Patent No.: US 8,148,262 B2
(45) Date of Patent: Apr. 3, 2012

(54) METHOD FOR MANUFACTURING SEMICONDUCTOR DEVICE

(75) Inventors: Shinichi Akiyama, Yokohama (JP); Kazuya Okubo, Yokohama (JP); Yusuke Morisaki, Yokohama (JP); Youichi Momiyama, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 134 days.

(21) Appl. No.: 12/793,216

(22) Filed: Jun. 3, 2010

(65) Prior Publication Data

US 2010/0330764 A1    Dec. 30, 2010

(30) Foreign Application Priority Data

Jun. 25, 2009 (JP) ................................ 2009-151574

(51) Int. Cl.
*H01L 21/44* (2006.01)
(52) U.S. Cl. ........ 438/655; 438/308; 438/581; 438/592; 438/630; 438/651; 438/653; 438/664; 257/377; 257/382; 257/412; 257/413; 257/E21.438
(58) Field of Classification Search .......... None
See application file for complete search history.

(56) References Cited

U.S. PATENT DOCUMENTS

| | | | |
|---|---|---|---|
| 6,514,859 B1 * | 2/2003 | Erhardt et al. | 438/664 |
| 2006/0057844 A1 * | 3/2006 | Domenicucci et al. | 438/655 |
| 2006/0240667 A1 * | 10/2006 | Matsuda et al. | 438/655 |
| 2009/0075477 A1 | 3/2009 | Kawamura et al. | |

FOREIGN PATENT DOCUMENTS

| | | |
|---|---|---|
| JP | 2008-078559 A | 4/2008 |
| JP | 2009-076605 A | 4/2009 |

OTHER PUBLICATIONS

K. G. Anil et al, "Demonstration of Fully Ni-Silicided Metal Gates on HfO2 based high-k gate dielectrics as a candidate for low power applications", Jun. 2004 Symposium on VLSI Technology: Digest of Technical Papers, pp. 190-191.

* cited by examiner

*Primary Examiner* — Charles Garber
*Assistant Examiner* — Yasser Abdelaziez
(74) *Attorney, Agent, or Firm* — Westerman, Hattori, Daniels & Adrian, LLP

(57) ABSTRACT

A method of manufacturing a semiconductor device includes forming a gate electrode, a source region and a drain region, forming a first metal layer,
  forming silicide layers by first annealing, removing a remainder of the first metal layer after the first annealing, performing a second annealing, forming a second metal layer, performing a third annealing, and removing a remainder of the second metal layer.

11 Claims, 27 Drawing Sheets

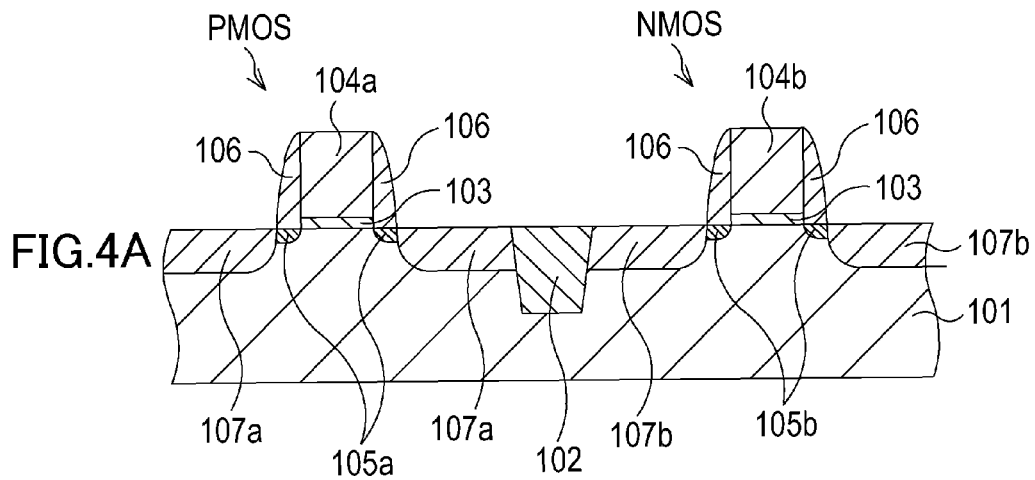
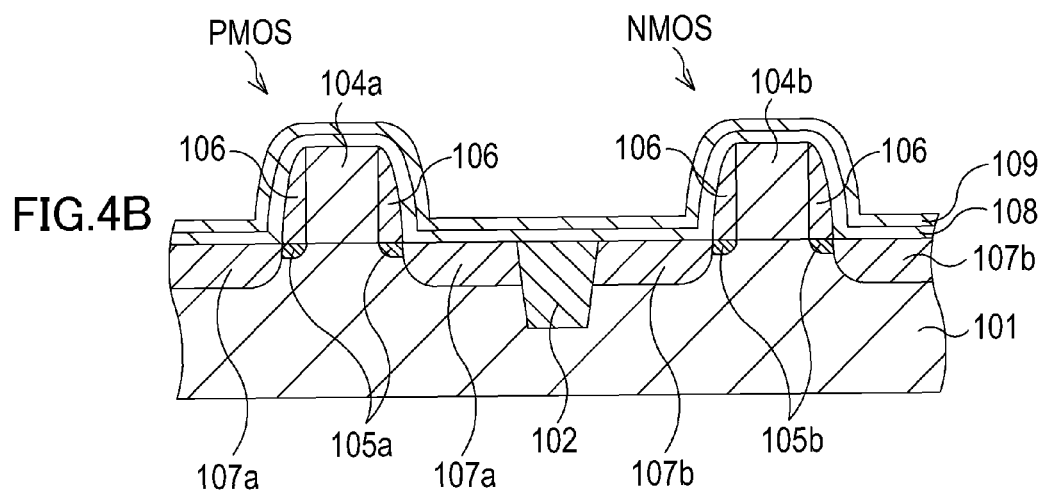
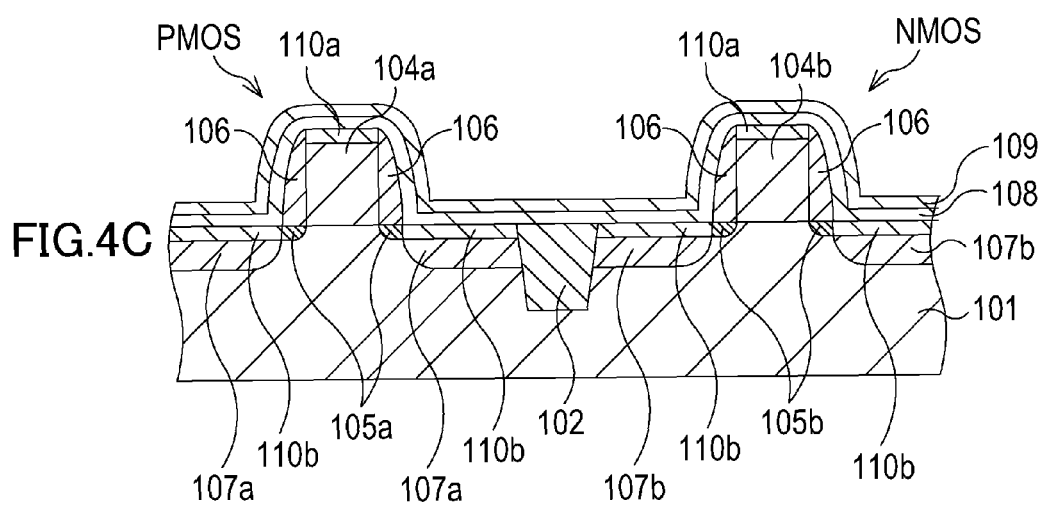

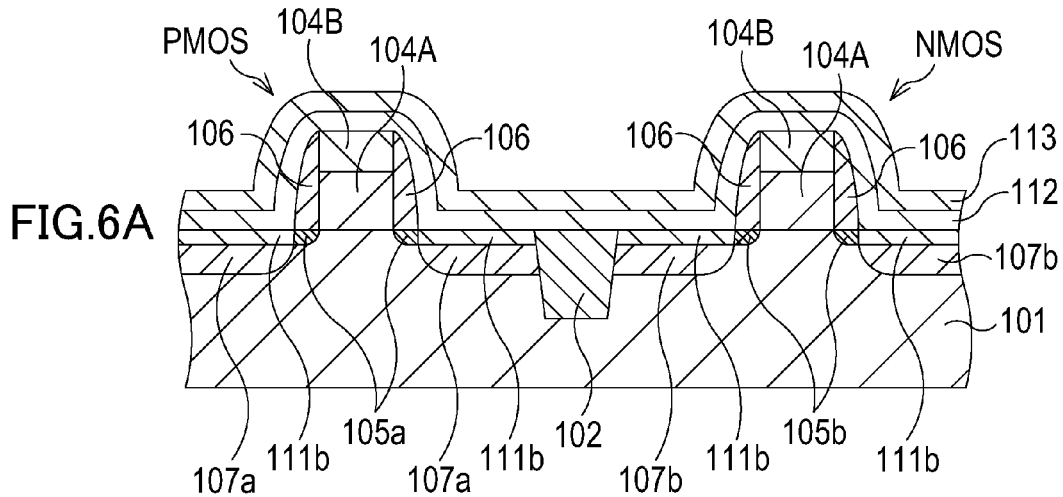
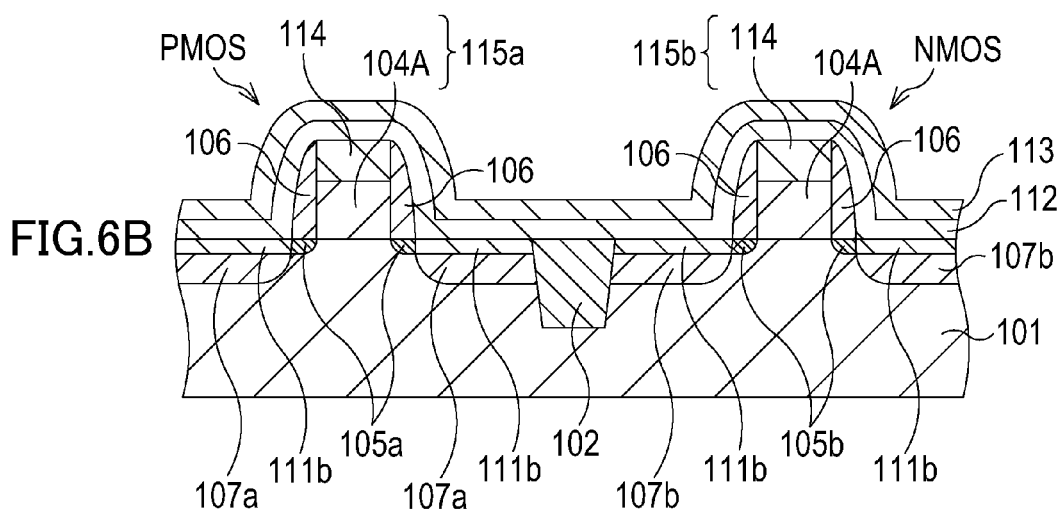
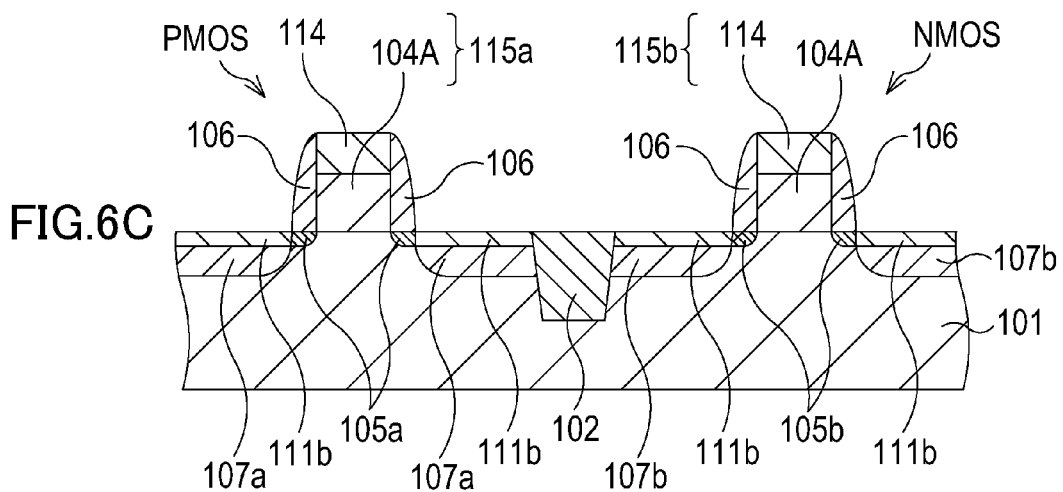

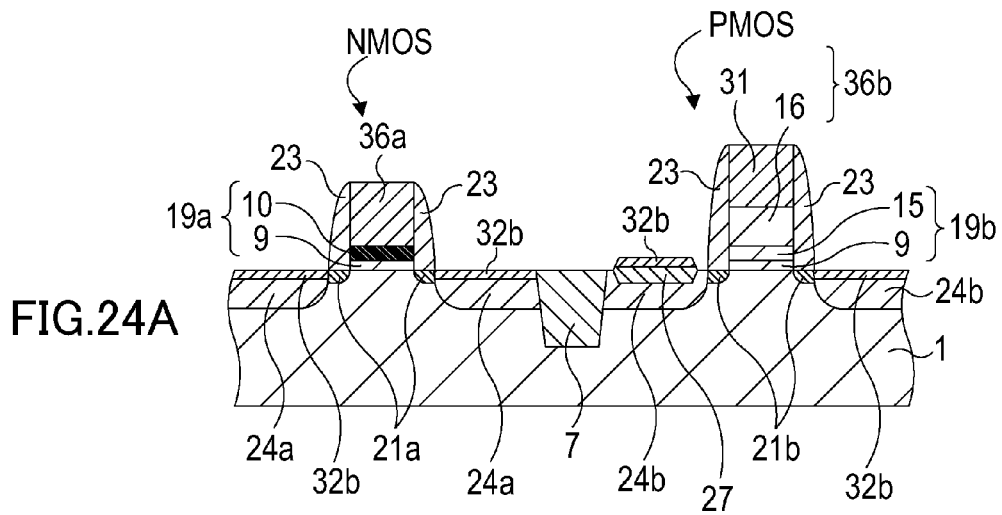
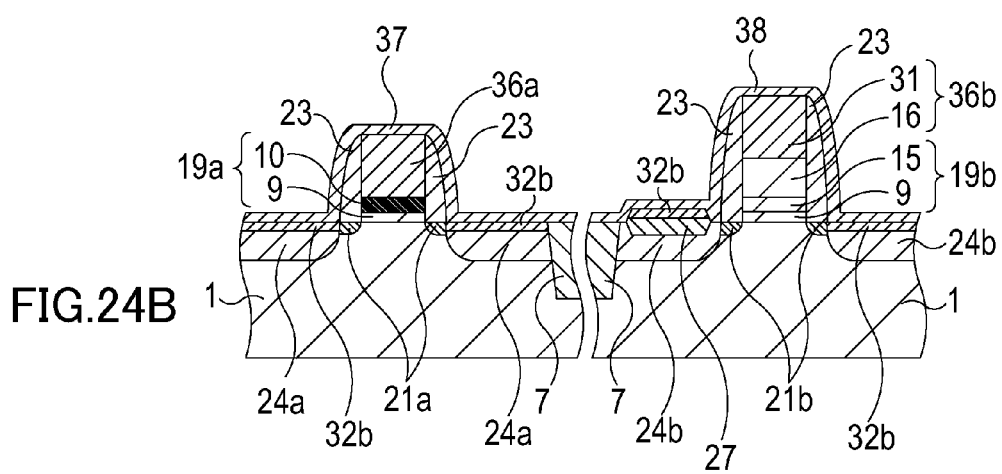
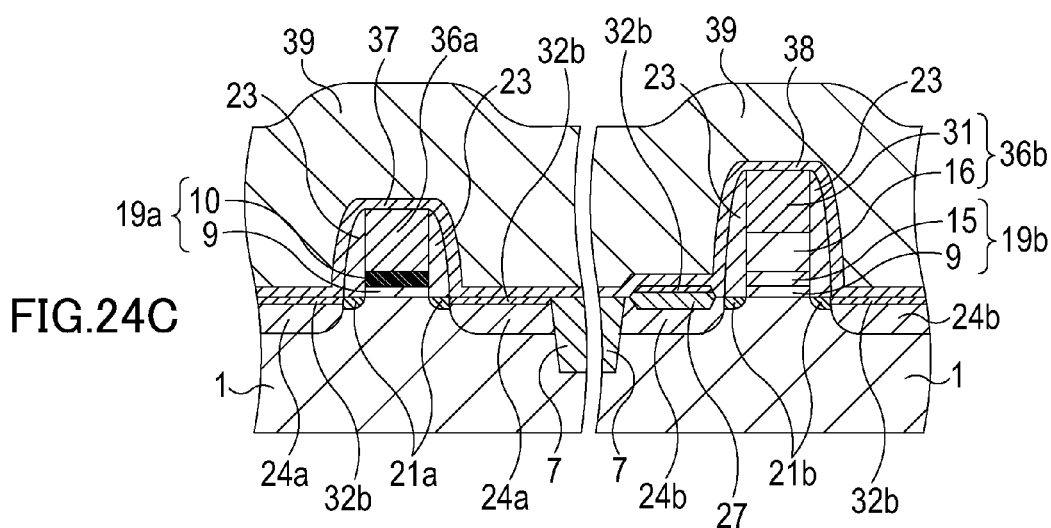

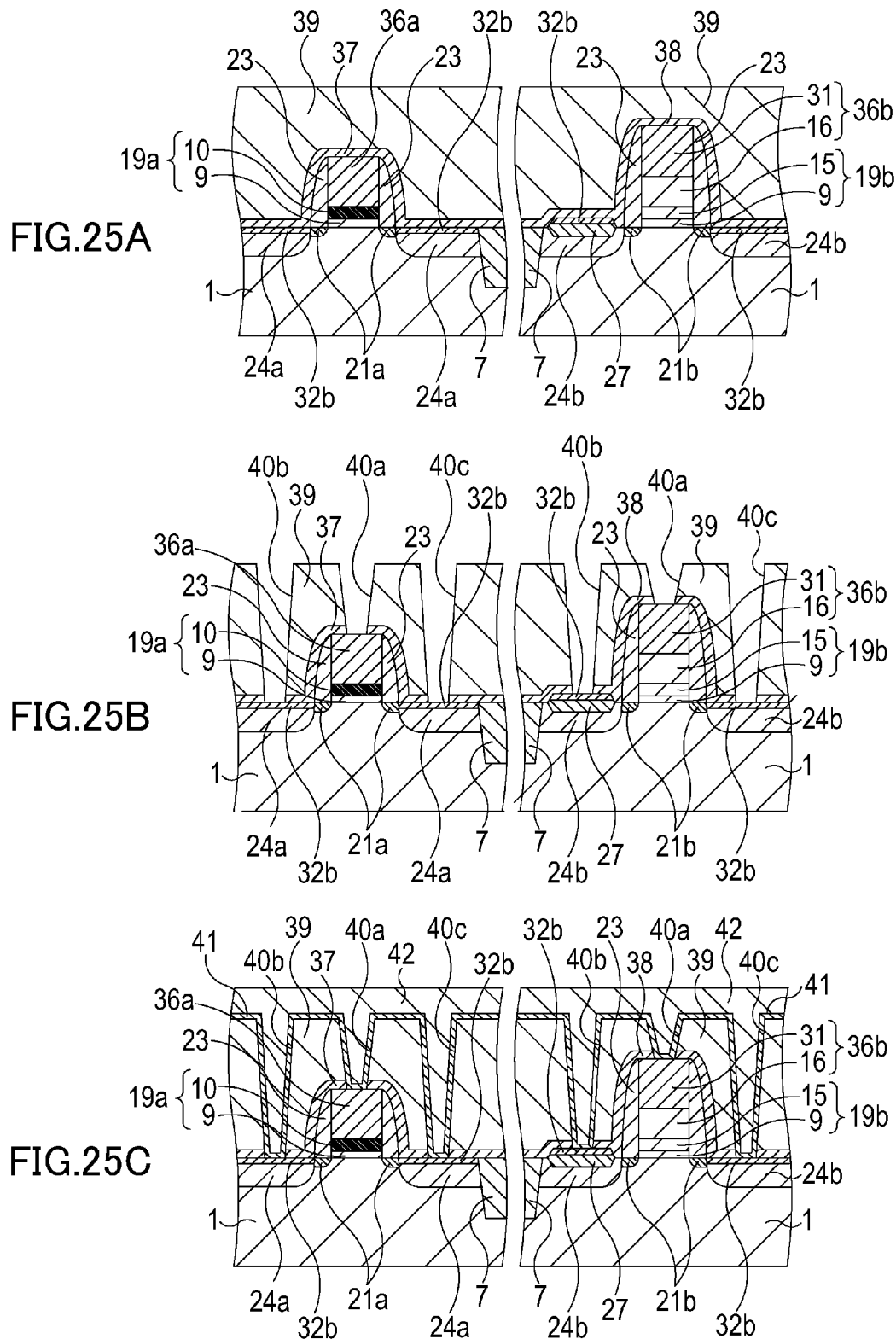

METHOD FOR MANUFACTURING SEMICONDUCTOR DEVICE

CROSS-REFERENCE TO RELATED APPLICATIONS

This application is based upon and claims the benefit of priority from the prior Japanese Patent Application No. 2009-151574, filed on Jun. 25, 2009, the entire contents of which is incorporated herein by reference.

FIELD

The present invention relates to a method for manufacturing a semiconductor device including a gate, a source and a drain.

BACKGROUND

In order to reduce the electric resistance of the gate electrode of a MOS transistor, for example, a technique has been developed for forming a silicide layer over the gate electrode by depositing a metal layer, such as of Ni, Ti or Co, on the gate electrode and then allowing the metal layer to react with the silicon of the gate electrode. Also, full silicidation has been studied for fully siliciding the gate electrode.

The full silicidation is also applied to a so-called self-aligned silicide (hereinafter referred to as salicide) technique for siliciding the upper portions of the source/drain regions as well as the gate electrode. In this instance, the upper portions of the source/drain regions are silicided while the gate electrode is entirely silicided.

For example, a salicide technique is described in K. G. Anil, et al., p. 190, 2004 Symposium on VLSI Technology Digest of Technical Papers.

FIGS. 1A to 1C and FIGS. 2A and 2B are sectional views of a process of a method for manufacturing a MOS transistor to which full silicidation is applied utilizing a salicide technique.

As illustrated in FIG. 1A, an element isolation region 211 is formed in a semiconductor substrate 201, and a gate electrode 203 of, for example, polycrystalline silicon is formed on the active region isolated by the element isolation region 211 with a gate insulating layer 202 therebetween. Source/drain regions 204 partially overlapping with extension regions 204a are formed in the surface of the semiconductor substrate 201 at both sides of the gate electrode 203. A cap layer 205 is formed of, for example, silicon nitride on the surface of the gate electrode 203, and a side wall insulating film 206 is formed of, for example, silicon oxide, on the side surface of the gate electrode 203. In this state, a Ni layer 207, which is a siliciding metal to be silicided, and a TiN layer 208 acting as a cap layer are formed in that order over the entire surface of the semiconductor substrate 201, and are then subjected to first annealing at 300° C. or less. A $Ni_2Si$ layer 209 is thus formed in the surfaces of the source/drain regions 204.

The unreacted Ni layer 207 and TiN layer 208 are selectively removed by wet etching, and then second annealing is performed at about 300° C. to 450° C., as illustrated in FIG. 1B. The $Ni_2Si$ layer 209 at the surface of the source/drain regions 204 is thus converted to a NiSi layer 210. Since the upper surface of the gate electrode 203 is covered with the cap layer 205, the gate electrode 203 is not silicided by the first and the second annealing for silicidation.

After the cap layer 205 is selectively removed by wet etching, an insulating layer, for example, an insulating interlayer 212 including silicon nitride, is deposited over the entire surface of the semiconductor substrate 201 to a thickness in which the gate electrode 203 may be buried, as illustrated in FIG. 1C. The insulating interlayer 212 and the side wall insulating film 206 are subjected to chemical-mechanical polishing (CMP) until the surface of the gate electrode 203 is exposed.

A Ni layer 213, which is to be silicided, is formed over the surface of the silicon nitride layer 212 including the surface of the gate electrode 20, as illustrated in FIG. 2A. Then, third annealing is performed at a temperature of about 300° C. to 500° C., such as 400° C., to silicide the entirety of the gate electrode 203, thus forming a fully silicided gate electrode 214, as illustrated in FIG. 2B. After selectively removing the unreacted Ni layer 213 by wet etching, contact holes, conductors and an insulating interlayer are formed. The present inventors have made patent applications related to silicidation, such as Japanese Laid-Open Patent Publication Nos. 2009-76605 and 2008-78559.

If full silicidation is performed in the salicide technique, the in-plane uniformity in flatness of the insulating interlayer 212, the gate electrode 203 and the side wall insulating film 206 is undesirably degraded by polishing the insulating interlayer 212 to planarize by CMP for the third annealing.

Polycrystalline silicon, which is the material of the gate electrode 203, and silicon oxide, which is the material of the side wall insulating film 206, have higher etching rates than silicon nitride, which is the material of the insulating interlayer 212. Accordingly, the level of the upper surface of the insulating interlayer 212 becomes lower than the levels of the upper surfaces of the gate electrode 203 and the side wall insulating film 206 at the time when CMP is completed. The in-plane uniformity in flatness of the insulating interlayer 212, the gate electrode 203 and the side wall insulating film 206 becomes insufficient.

A plurality of gate electrodes 203 are formed on a semiconductor substrate 201, and they may be disposed close to each other or apart from each other depending on the region. In this instance, CMP is performed on the silicon nitride layer covering the plurality of gate electrodes 203, and the above-mentioned difference in etching rate causes the degree of polishing the insulating interlayer 212 to differ depending on the density of the gate electrodes 203.

The plurality of gate electrodes 203 are present with various gate lengths. In this instance, the above-mentioned difference in etching rate causes the degree of polishing the insulating interlayer 212 to differ depending on the gate length of the gate electrode 203.

The difference in degree of polishing the insulating interlayer 212 varies the contact area between the siliciding metal and the gate electrodes 203, and consequently results in non-uniformity of the resulting silicide.

SUMMARY

According to an aspect of the invention, a method of manufacturing a semiconductor device includes forming a gate electrode, a source region and a drain region, forming a first metal layer, forming silicide layers by first annealing, removing the first metal layer after the first annealing, performing a second annealing, forming a second metal layer, performing a third annealing, and removing the second metal layer.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIGS. 4A to 4C, 5A to 5C and 6A to 6C are sectional views of the process of a method for manufacturing a CMOS transistor according to a first embodiment.

FIGS. 9A to 9C, 10A to 10C, 11A to 11C, 12A to 12C, 13A to 13C, 14A to 14C, 15A to 15C, 16A to 16C, 17A to 17C, 18A to 18C, 19A to 19C, 20A to 20C, 21A to 21C, 22A to 22C, 23A to 23C, 24A to 24C, 25A to 25C, 26A and 26B, and 27 are sectional views of the process of a method for manufacturing a MOS transistor according to a second embodiment of the present invention.

DESCRIPTION OF EMBODIMENTS

In Japanese Laid-Open Patent Publication No. 2009-76605, flash lamp annealing is performed on a semiconductor substrate in a state where the surface layer of the gate electrode and the surface layers of the source/drain regions have been silicided. The gate electrode is selectively silicided fully to form a fully silicided gate electrode by this flash lamp annealing while, for example, a NiSi layer is maintained in the source/drain regions.

Figure 1A:
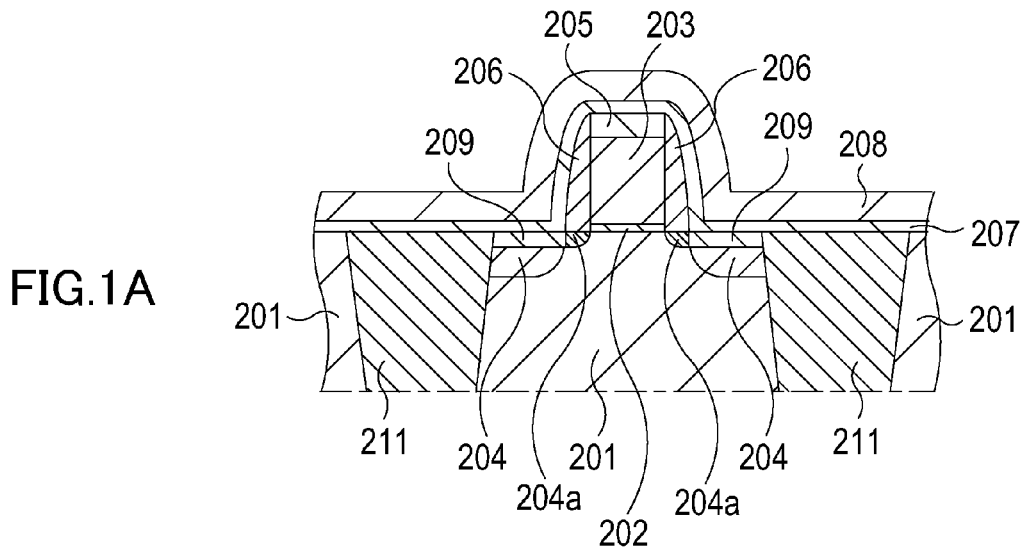
FIGS. 1A to 1C and 2A and 2B are sectional views of the process of a method for manufacturing a known MOS transistor.
Figure 1B:
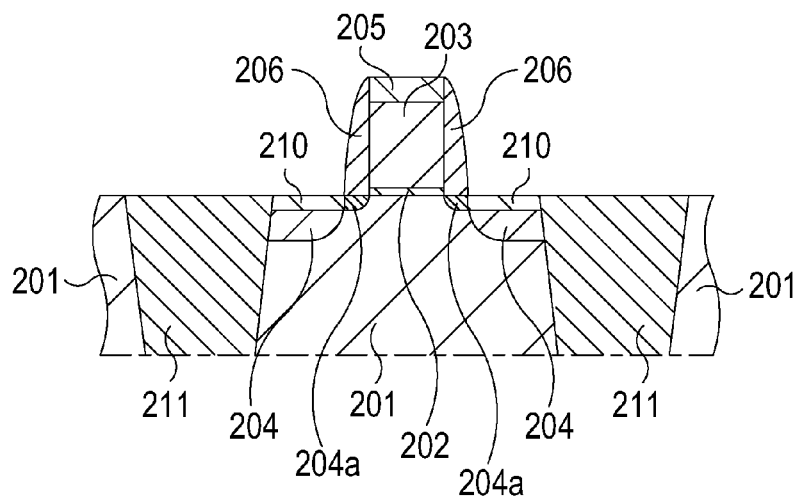
Figure 1C:
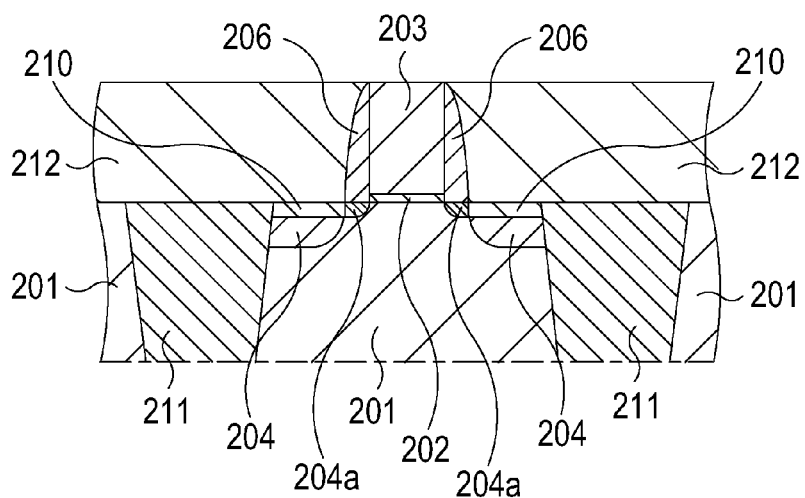
Figure 2A:
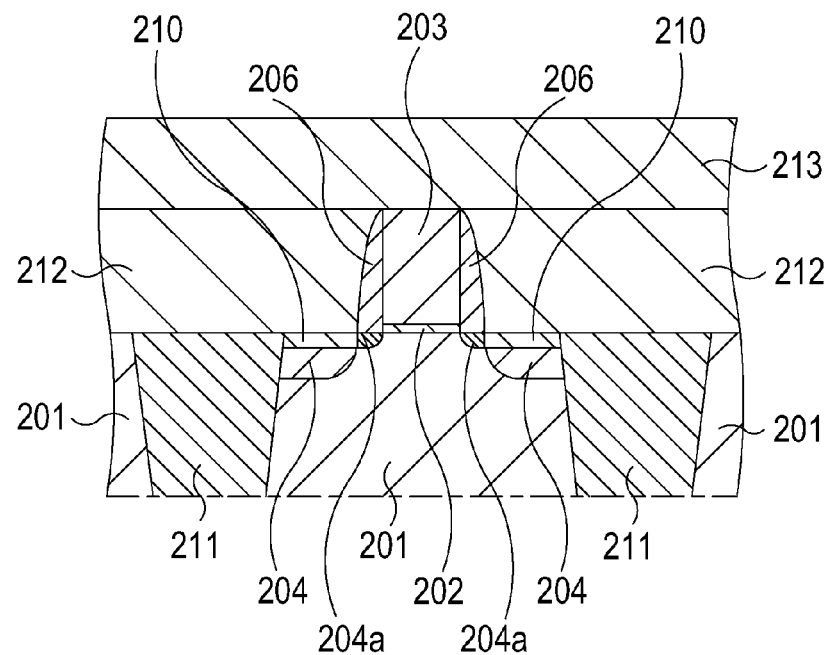
Figure 2B:
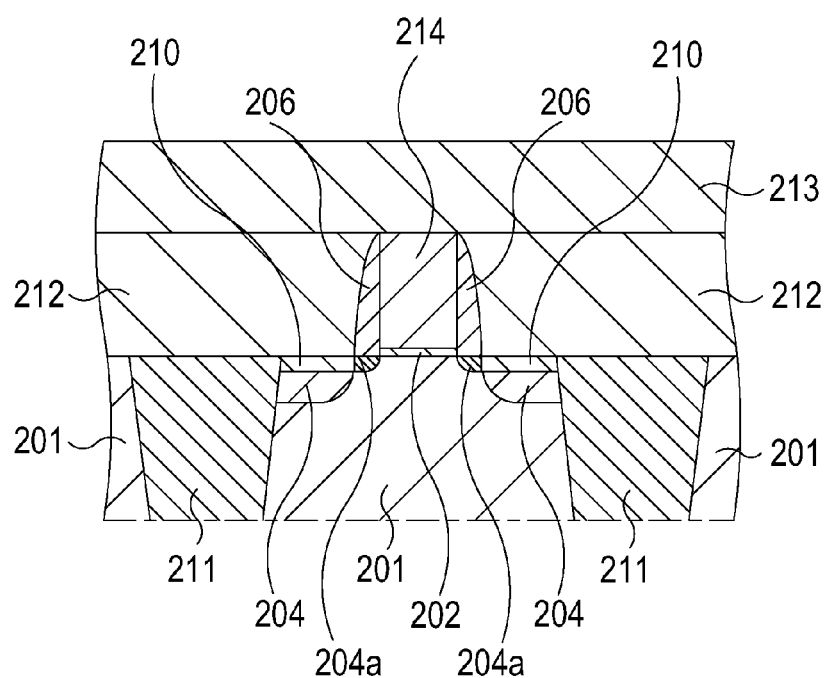
Figure 3:
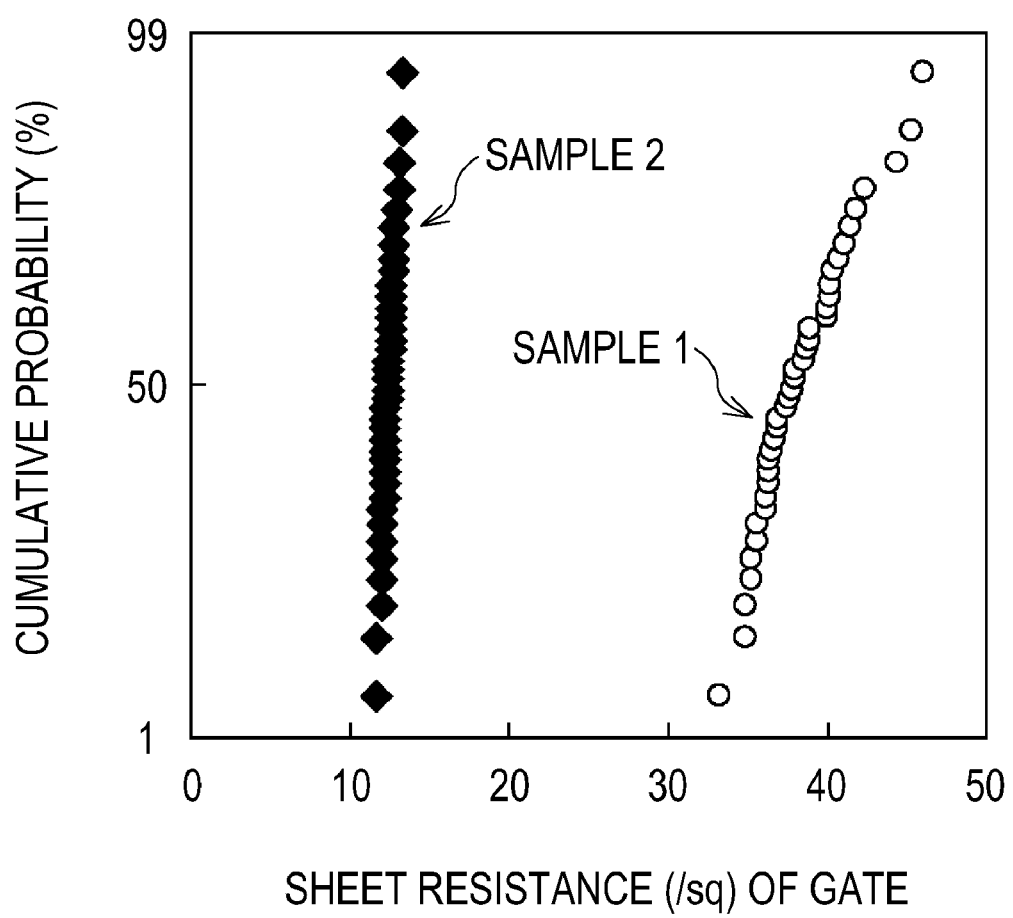
FIG. 3 is a plot illustrating the relationship between the sheet resistance of a MOS transistor including a fully silicided gate electrode and its cumulative probability.

FIG. 3 illustrates the relationship between the sheet resistance (Ω/square) of a MOS transistor (Sample 1) including a fully silicided gate electrode formed according to Japanese Laid-Open Patent Publication No. 2009-76605 and its cumulative probability. For the sake of comparison, the relationship of a MOS transistor (Sample 2) whose gate electrode has been silicided at the upper portion is illustrated together. The MOS transistor of Sample 1 exhibited a higher sheet resistance than that of Sample 2, and its sheet resistance exhibited large variation among products.

In order to investigate the reason why the sheet resistance of Sample 1 had a large variation, a plurality of MOS transistors was prepared according to the technique of Japanese Laid-Open Patent Publication No. 2009-76605. As a result, about 90% of the MOS transistors had fully silicided gate electrodes while the other 10% had gate electrodes including a silicon upper layer and a silicided lower layer.

The phenomenon in which two species are mingled is generally referred to as diffusion. A diffusion caused by applying a thermal energy sufficient to cut the bonds between atoms and transfer the atoms is referred to as thermal diffusion. The velocity of mass transfer is referred to as diffusion flux, and the diffusion flux is proportional to the concentration gradient. This is Fick's first law:

$$J = -D \cdot (dC/dx)$$

where J is the diffusion flux;
D is the diffusion coefficient;
C is the concentration of transferring species; and
x is the distance in a one-dimensional direction.

When Ni is diffused in the direction from the upper portion to the lower portion of a polycrystalline silicon layer, the Ni concentration is increased toward the upper portion and reduced toward the lower portion since the transferring species are diffused by concentration gradient. Hence, the gate electrode including a silicon upper portion and a silicided lower portion is not formed by thermal diffusion caused in a conventional silicidation process.

The NiSi phase and the $NiSi_2$ phase have meting points of about 1000° C. If the gate electrode is selectively subjected to momentary heat treatment at about 1000° C. to 1400° C., the silicide layer of the gate electrode is first melted. The gate electrode is formed of a NiSi phase before flash lamp annealing, and it may be melted by the heat treatment as it is or after being converted to a $NiSi_2$ phase. Since bulk silicon crystal has a melting point of 1400° C. or more, the bulk silicon is not normally melted at the temperature of the above heat treatment. However, a polycrystalline silicon layer directly under a melted silicide layer has a surface energy at the uppermost surface and is thus melted at a temperature of 1400° C. or less. Thus, the interior of the gate electrode comes to a state where silicon atoms are mingled in the melted silicide fluid. When the flash lamp annealing has been finished, silicon having a higher melting point first separates out and a state including solid silicon and liquid silicide is formed during cooling. At this time, silicon is exposed at the top of the gate electrode. This is because Si has a lower specific gravity than $NiSi_2$, or because the gate electrode is cooled from the upper portion, which is not enclosed by an insulating layer. When the gate electrode has been further cooled, solid silicide ($NiSi_2$ phase) is formed in the lower portion of the gate electrode. Whether this silicide phase is NiSi or $NiSi_2$ depends on the proportion of Si and Ni in the gate electrode. For example, if 66.7 atomic percent (at. %) or more of Si is present in the gate electrode, a $NiSi_2$ phase is formed in the lower portion of the gate electrode.

Even if a Ni phase is formed on the $NiSi_2$ phase of the gate electrode and the gate electrode is subjected to heat treatment at a temperature of about 200 to 600° C. at which NiSi may be formed, the phase transition of $NiSi_2$ phase to NiSi does not occur, or the phenomenon does not occur in which the NiSi phase is formed at the upper portion. This is because $NiSi_2$ is generally formed by heat treatment at 600° C. to 900° C., and because $NiSi_2$ forms the most stable phase.

In the present embodiment, the gate electrode and the source/drain regions in a state where their surfaces have been silicided are further silicided by millisecond annealing (msec annealing) such as flash lamp annealing or laser annealing.

When msec annealing has been performed, the excess Si other than the Si used for forming a desired silicide phase forms a Si layer at the upper portion of the gate electrode. Subsequently, a metal layer including Ni is formed to cover the gate electrode and is then annealed to supply Ni further to the upper portion of the gate electrode. If the temperature of this annealing is more than 600° C., the NiSi layer formed at the upper portions of the source/drain regions may become thick, and consequently a junction leakage current may occur between the source/drain regions and the semiconductor substrate. Accordingly, the annealing temperature is set in the range of 200° C. to 600° C., preferably 200° C. to 450° C.

FIGS. 4A to 4C, 5A to 5C and 6A to 6C are sectional views of the process of a method for manufacturing a CMOS transistor according to a first embodiment. As illustrated in FIG. 4A, an element isolation structure 102 is formed in the semiconductor substrate 101, and then members or parts of the CMOS transistors are formed, such as a gate insulating layer 103, gate electrodes 104a and 104b, extension regions 105a and 105b, side wall insulating films 106, and source/drain regions 107a and 107b.

More specifically, element isolation structures 102 are formed in the semiconductor substrate 101. The element isolation structures 102 define an NMOS active region in which an n-type MOS transistor is to be formed, and a PMOS active region in which a p-type MOS transistor is to be formed. A resist is applied onto the semiconductor layer 101, and is then subjected to lithography to form a resist mask having openings between the adjacent element isolation structures 102. The active regions are partially exposed in the respective openings. Channel dose ion implantation is performed on the active regions of the semiconductor substrate 101 for controlling the threshold. For an n-type MOS transistor, for example, boron ions ($B^+$) are implanted in a dose of 0 to $1.0 \times 10^{13}/cm^2$ at an acceleration energy of 25 keV. For a p-type MOS transistor, for example, arsenic ions ($As^+$) are implanted in a dose of 0 to $5.0 \times 10^{12}/cm^2$ at an acceleration energy of 80 keV. The resist mask is removed by ashing or the like.

After annealing for activating the introduced dopant, a gate insulating layer 103 is formed over the active regions of the semiconductor substrate 101. For example, an insulating material, such as silicon oxide, is deposited to a thickness of about 0.7 nm by CVD. Further, a HfSiO layer is formed to a thickness of about 2.8 nm on the silicon oxide layer, and is then converted to a HfSiON layer by plasma nitridation followed by annealing performed at 1050° C. for 5 seconds in a $N_2$ atmosphere. Thus, the gate insulating layer 103 including a silicon oxide layer and a HfSiON layer is formed.

Gate electrodes 104a and 104b are formed on the gate insulating layer 103. For example, polycrystalline silicon is deposited to a thickness of about 50 nm by CVD, and then silicon nitride is deposited to a thickness of about 50 nm by CVD, thus forming a hard mask. A resist mask having a shape of electrodes is formed on the hard mask by lithography, and the hard mask is etched through the resist mask by a dry process. After removing the resist mask by ashing or the like, the polycrystalline silicon layer and the gate insulating layer 103 are etched through the hard mask by a dry process. Thus, the gate electrodes 104a and 104b are formed on the gate insulating layer 103, respectively in the NMOS active region and the PMOS active region. The hard mask is then removed.

Extension regions 105a and 105b are formed at both sides of the gate electrode 104a in the NMOS active region and the gate electrode 104b in the PMOS active region. In the NMOS active region, n-type dopant, such as arsenic ($As^+$), is introduced to the surface layer of the semiconductor substrate 101 at both sides of the gate electrode 104a using the gate electrode 104a and a resist mask as a mask. The extension regions 105a are thus formed. In the PMOS active region, p-type dopant, such as boron ($B^+$), is introduced to the surface layer of the semiconductor substrate 101 at both sides of the gate electrode 104b using the gate electrode 104b and a resist mask as a mask. The extension regions 105b are thus formed.

Side wall insulating films 106 are formed on both sides of the gate electrodes 104a and 104b. More specifically, an insulating layer is formed to cover the entire surface of the semiconductor substrate 101 including the gate electrodes 104a and 104b. In the present embodiment, a silicon oxide layer is deposited to a thickness of about 10 nm to 100 nm. Subsequently, the entire surface of the silicon oxide layer is anisotropically dry-etched by reactive ion etching (RIE) so as to remain on both sides of the gate electrodes 104a and 104b. The side wall insulating films 106 are thus formed on both sides of the gate electrodes 104a and 104b.

Source/drain regions 107a and 107b partially overlapping with the extension regions 105a and 105b are formed in the surface of the semiconductor substrate 101. In the NMOS active region, n-type dopant, such as arsenic ($As^+$), is introduced to the surface of the semiconductor substrate 101 at both sides of the gate electrode 104a with the side wall insulating films 106 using a resist mask, the gate electrode 104a and the side wall insulating films 106 as a mask. The source/drain regions 107a partially overlapping with the extension regions 105a are thus formed. In the PMOS active region, p-type dopant, such as boron ($B^+$), is introduced to the surface of the semiconductor substrate 101 at both sides of the gate electrode 104b with the side wall insulating film 106, using a resist mask, the gate electrode 104b and the side wall insulating film 106 as a mask. The source/drain regions 107b partially overlapping with the extension regions 105b are thus formed.

The introduced dopant is activated, for example, by spike annealing of the semiconductor substrate 101 at a temperature of 1015° C. for about a few miliseconds.

Turning now to FIG. 4B, a Ni layer 108, which is to be silicided, and a cap layer 109 are formed in that order to cover the entire surface of the semiconductor substrate 101. First, naturally oxidized films formed on the gate electrodes 104a and 104b and the source/drain regions 107a and 107b are removed by treatment with hydrofluoric acid. As an alternative to the hydrofluoric acid treatment, Ar sputtering may be performed to physically remove the naturally oxidized films. Alternatively, the naturally oxidized films may be removed by chemical treatment for reduction using nitrogen trifluoride ($NF_3$) gas plasma or $H_2$ gas plasma. For this chemical treatment, for example, $(NH_4)_2SiF_6$ is produced from $NF_3$ gas and $NH_3$ gas, and further Ar gas or $H_2$ gas by remote plasma, followed by sublimating. The naturally oxidized films may thus be removed by reduction.

A Ni target, which is a target of siliciding metal, is prepared. A Ni layer 108 is formed to a thickness of about 5 to 20 nm, such as about 13 nm, over the entire surface of the semiconductor substrate 101 including the gate electrodes 104a and 104b, the side wall insulating films 106, and the source/drain regions 107a and 107b by sputtering using the Ni target. As an alternative to sputtering, the Ni layer 108 may be formed by electron beam vapor deposition.

The Ni layer 108 may be covered with a cap layer 109 formed by depositing TiN to a thickness of about 5 to 50 nm, such as about 10 nm, by, for example, sputtering. The cap layer 109 may be formed by depositing Ti to a thickness of about 5 nm to 30 nm.

As an alternative to the Ni layer 108, a Ni alloy layer may be formed. For example, the Ni alloy layer may be formed by sputtering using a Ni alloy target including Ni and at least one element selected from the group consisting of Pt, Ta, W, Re, Y, Yb, Al, La, and Ti. If a NiPt layer is formed as the Ni alloy layer, a Ni alloy target including, for example, 5 at. % of Pt may be used. Such a Ni alloy layer may suppress excessive supply of Ni to the surface layers of the source/drain regions 107a and 107b.

Turning now to FIG. 4C, the surface layers of the gate electrodes 104a and 104b and the surface layers of the source/drain regions 107a and 107b are silicided into $Ni_2Si$ layers 110a and 110b. More specifically, the first annealing is performed at a temperature of 300° C. or less, such as 250° C., for 120 seconds. The surface layers of the gate electrodes 104a and 104b and the surface layers of the source/drain regions 107a and 107b are silicided by this first annealing. Consequently, the $Ni_2Si$ layer 110a is formed at the surfaces of the gate electrodes 104a and 104b, and the $Ni_2Si$ layer 110b is formed at the surfaces of the source/drain regions 107a and 107b. The first annealing may be performed by furnace annealing or a combination of furnace annealing and rapid heating, instead of the above-described rapid annealing. If the metal layer to be silicided is made of NiPt, as described above, the annealing may be performed effectively at a temperature of 200° C. to 290° C. using a target including 1 at. % to 10 at. % of Pt.

Figure 5A:
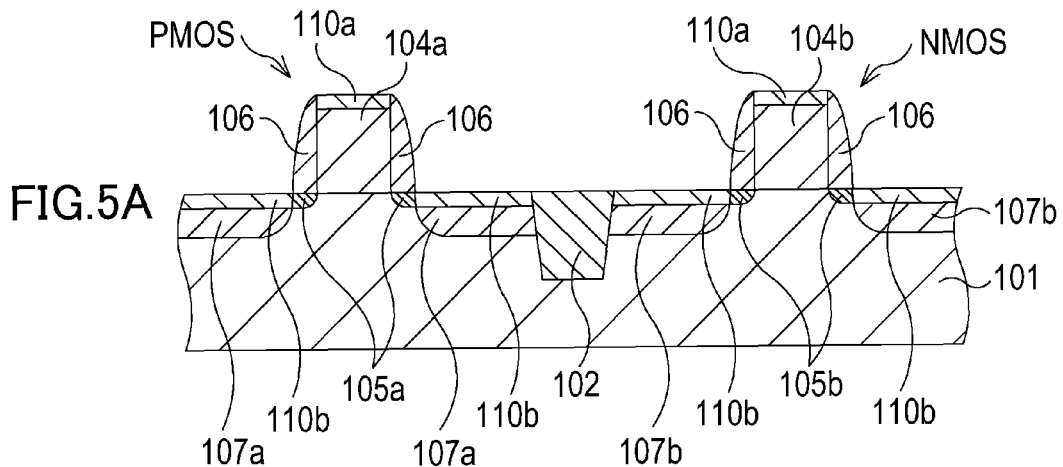

Turning now to FIG. 5A, the cap layer 109 and the unreacted Ni layer 108 are removed. More specifically, the cap layer 109 and the unreacted Ni layer 108 are selectively removed by chemical treatment with, for example, a mixed solution of sulfuric acid and hydrogen peroxide water (hereinafter referred to as SPM solution). The mixing ratio of sulfuric acid to hydrogen peroxide water is, for example, 3:1. As an alternative to the SPM solution, a mixed solution of hydrochloric acid and hydrogen peroxide water may be used.

Figure 5B:
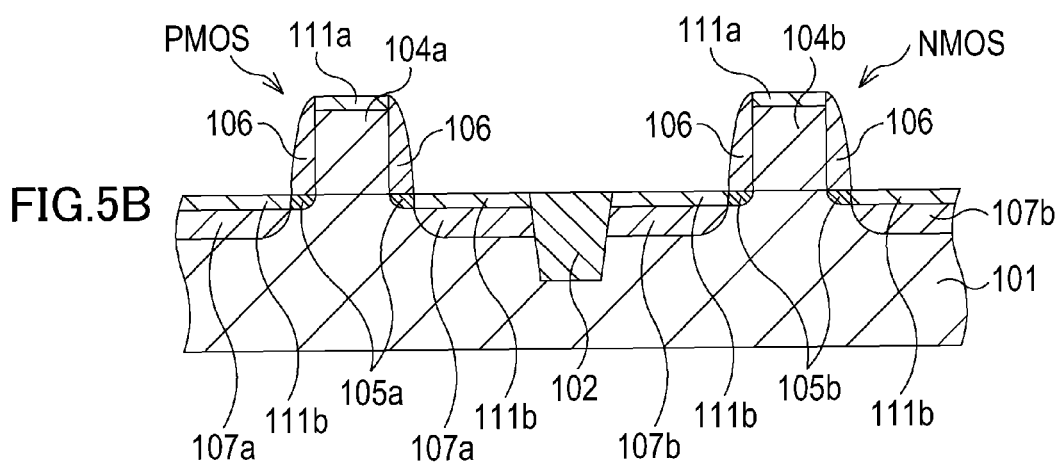

Turning to FIG. 5B, the surface layers of the gate electrodes 104a and 104b and the surface layers of the source/drain regions 107a and 107b are silicided again into NiSi layers 111a and 111b. More specifically, a second annealing is performed at a temperature of 350° C. to 600° C., such as 400° C., for 10 seconds to 120 seconds, such as 30 seconds. Consequently, the surface layers of the gate electrodes 104a and 104b and the surface layers of the source/drain regions 107a and 107b are silicided. The $Ni_2Si$ layers 110a of the gate electrodes 104a and 104b are thus converted to the NiSi layer 111a, and the $Ni_2Si$ layers 110b of the source/drain regions 107a and 107b are converted to the NiSi layer 111b.

Subsequently, the semiconductor substrate 101 is subjected to msec annealing. In the present embodiment, flash lamp annealing is performed. The msec annealing refers to a technique for heat treatment rapidly performed on the order of milliseconds, and generally refers to annealing performed for about 0.001 s to 0.01 s. The flash lamp annealing is conducted by irradiating the semiconductor substrate 101 with light from a lamp held at 300° C. to 450° C. The temperature of the semiconductor substrate 101 kept without irradiation with the lamp is referred to as assist temperature. The flash lamp annealing is performed at an irradiation energy in the range of 24 $J/cm^2$ to 28 $J/cm^2$ for an irradiation time in the range of 0.5 ms to 1.5 ms. The assist temperature is in the range of the temperatures of the rapid annealing for the second annealing described with reference to FIG. 5B. Accordingly, the rapid annealing in the step illustrated in FIG. 5B and the flash lamp annealing may be continuously performed in a flash lamp annealing apparatus.

Figure 5C:
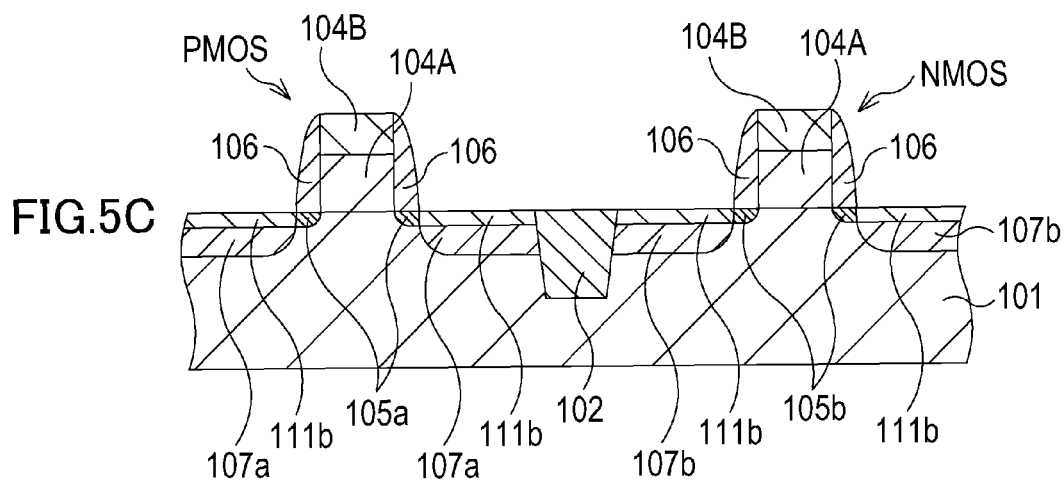

The flash lamp annealing selectively converts the NiSi layers 111a of the gate electrodes 104a and 104b while the NiSi layers 111b are maintained in the source/drain regions 107a and 107b. Consequently, for example, about 90 percent of the plurality of gate electrodes 104a and 104b are fully silicided into $NiSi_2$ as described above. On the other hand, the other 10 percent are silicided in such a manner that a Si layer 104B remains at the top of each gate electrode while the portion under the Si layer 104B is silicided into a $NiSi_2$ layer 104A. FIG. 5C shows CMOS transistors in which the Si layer 104B remains at the top of the gate electrodes 104a and 104b. The following figures show these CMOS transistors.

In the present embodiment, laser annealing may be performed as msec annealing, instead of flash lamp annealing. In this instance, laser annealing is performed at a stage temperature of 400° C. while the reading of a pyrometer is controlled in the range of 700° C. to 1000° C. For the laser annealing, the temperature of the substrate is measured and controlled with a pyrometer. The pyrometer equalizes the temperatures of the element isolation regions, the gate electrodes, the source/drain regions and other parts of the semiconductor substrate, and monitors the equalized temperature. Hence, the temperature indicated on the pyrometer does not represent the respective temperatures of the gate electrodes, the source/drain regions and others.

The Si layers 104B exposed at the top of the gate electrodes 104a and 104b are silicided. This silicidation is performed on the CMOS transistor including the gate electrode fully silicided by flash lamp annealing. The fully silicided gate electrode may exhibit high transistor performance even in this silicidation.

Naturally oxidized films formed on the gate electrodes 104a and 104b and the source/drain regions 107a and 107b are removed. If wet etching is performed with hydrofluoric acid, the NiSi layers 111b of the source/drain regions 107a and 107b are also etched undesirably. Accordingly, the naturally oxidized films are removed by, for example, Ar sputtering with ICP plasma. The Ar sputtering is performed to a depth of, for example, about 2 nm in terms of the thickness of the naturally oxidized silicon oxide film. Alternatively, the naturally oxidized films may be removed by chemical treatment for reduction using nitrogen trifluoride ($NF_3$) gas plasma or $H_2$ gas plasma, instead of Ar sputtering. For this chemical treatment, for example, $(NH_4)_2SiF_6$ is produced from $NF_3$ gas and $NH_3$ gas, and further Ar gas or $H_2$ gas by remote plasma, followed by sublimating. The naturally oxidized films may thus be removed by reduction.

Turning now to FIG. 6A, a Ni layer 112, which is to be silicided, and a cap layer 113 are formed in that order to cover the entire surface of the semiconductor substrate 101. A Ni target, which is a target of siliciding metal, is prepared. The Ni layer 112 is formed to a thickness of about 9 nm over the entire surface of the semiconductor substrate 101 including the gate electrodes 104a and 104b with the side wall insulating films 106 by sputtering using the Ni target. As an alternative to sputtering, electron beam vapor deposition may be performed to form the Ni layer 112.

The Ni layer 112 may be covered with a cap layer 113 formed by depositing TiN to a thickness of about 5 nm to 50 nm, such as 10 nm, for example, by sputtering. The cap layer 113 may be formed by depositing Ti to a thickness of about 5 nm to 30 nm.

As an alternative to the Ni layer 113, a Ni alloy layer may be formed. For example, the Ni alloy layer may be formed by sputtering using a Ni alloy target including Ni and at least one element selected from the group consisting of Pt, Ta, W, Re, Y, Yb, Al, La, and Ti. If a NiPt layer is formed as the Ni alloy layer, a Ni alloy target including 1 at. % to 10 at. % of Pt, preferably 2 at. % to 10 at. % of Pt, such as 5 at. %, may be used.

Turning to FIG. 6B, the Si layers 104B exposed at the top of the gate electrodes 104a and 104b are silicided to form NiSi layers 114. More specifically, annealing (third annealing) is performed at a temperature in the range of 200° C. to 600° C., preferably in the range of 200° C. to 450° C. For example, the annealing may be performed at 400° C. for 30 seconds. The Si layers 104B exposed at the top of the gate electrodes 104a and 104b are silicided by the third annealing, and thus the NiSi layer 114 is formed at the surfaces of the gate electrodes 104a and 104b. The gate electrodes 104a and 104b are thus converted to a fully silicided gate electrodes 115a and 115b, each including the $NiSi_2$ layer 104A and the NiSi layer 114.

The thickness of the NiSi layer 111b of the source/drain regions 107a and 107b may be increased by the third annealing.

The cap layer 113 and the unreacted Ni layer 112 are removed as illustrated in FIG. 6C. More specifically, the cap layer 113 and the unreacted Ni layer 112 are selectively removed by chemical treatment using an SPM solution. The SPM solution refers to a mixed solution of sulfuric acid and hydrogen peroxide water, as described above. As an alternative to the SPM solution, a mixed solution of hydrochloric acid and hydrogen peroxide water may be used.

Subsequently, an insulating interlayer, contact plugs, and conductors are formed.

In the present embodiment, as an alternative to the Ni layers to be silicided by the first annealing and the third annealing, a Ni alloy layer may be formed which includes Ni and at least one element selected from the group consisting of Pt, Ta, W, Re, Y, Yb, Al, La, and Ti. A technique for siliciding a Ni alloy layer is disclosed in Japanese Laid-Open Patent Publication No. 2008-78559 the contents of which are incorporated herein by reference.

The behavior of the Ni and Pt atoms in, for example, a $Ni_{95}Pt_5$ layer deposited on the surface of a Si substrate and then annealed was observed by EDX analysis (energy dispersion X-ray analysis). The results of the analysis will be described below. For preparing a sample, a $Ni_{95}Pt_5$ layer was deposited to a thickness of about 20 nm on the surface of a Si semiconductor substrate, and the $Ni_{95}Pt_5$ layer was subjected to the first annealing at 240° C. for 120 seconds. After the unreacted Ni was removed with an SPM solution, the second annealing was performed at 400° C. to obtain the sample. A silicide layer is formed at the surface of the Si substrate, and Ni is substantially uniformly distributed in the entirety of the silicide layer. Pt is distributed mainly in the substantially upper half of the thickness of the silicide layer in such a manner that it is present particularly in a high concentration in a region shallower than the upper half of the thickness. This suggests that Pt segregated at the surface of the silicide layer suppresses the excessive supply of Ni from the Ni layer to be formed over the Pt portion. Accordingly, the thickness of the NiSi layers 111b of the source/drain regions 107a and 107b may be suppressed from increasing by forming the above Ni alloy layer instead of the Ni layer before the first and the third annealing, and then annealing the Ni alloy layer.

Figure 7:
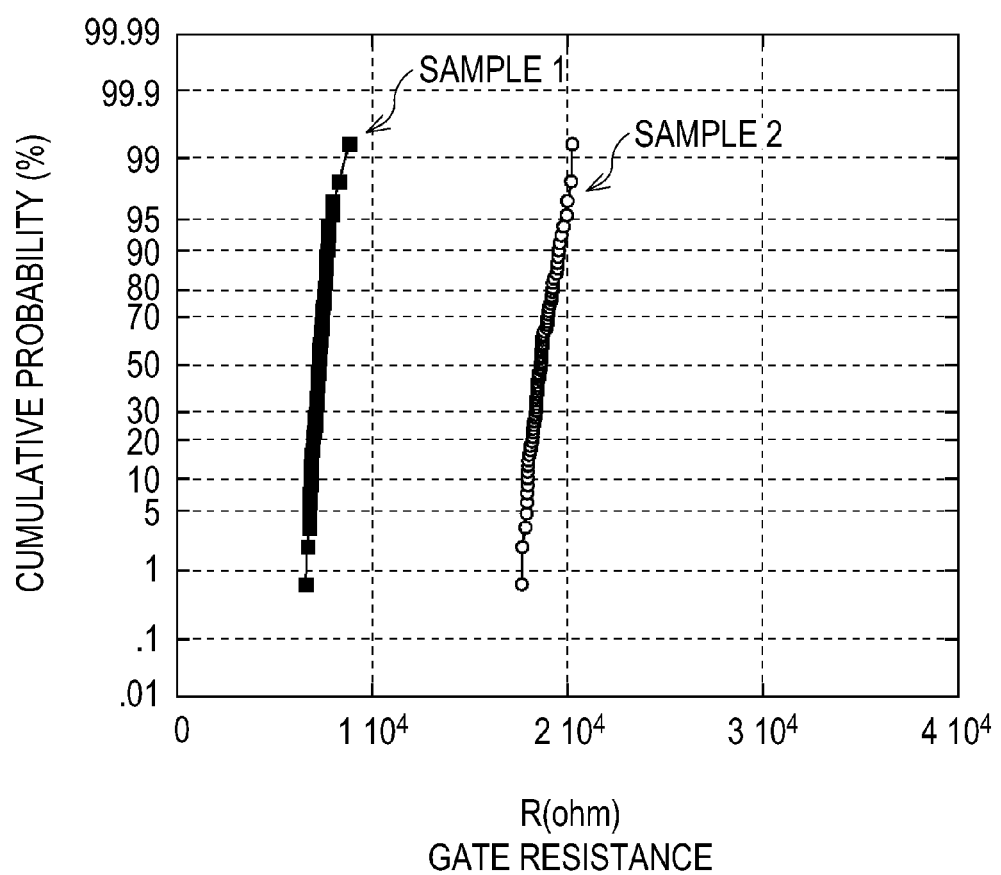
FIG. 7 is a plot of the relationship between the resistance of the MOS transistor of the first embodiment and its cumulative probability.

FIG. 7 shows the relationship between the resistance (Ω) of a MOS transistor (Sample 1) including a fully silicided gate electrode formed according to the present embodiment and the cumulative probability of products. For the sake of comparison, the relationship of a MOS transistor (Sample 2) in which at least the upper portion of the gate electrode has been silicided is also illustrated. The MOS transistor of Sample 1 exhibited a lower resistance than that of Sample 2, and a smaller variation in resistance among products.

Figure 8:
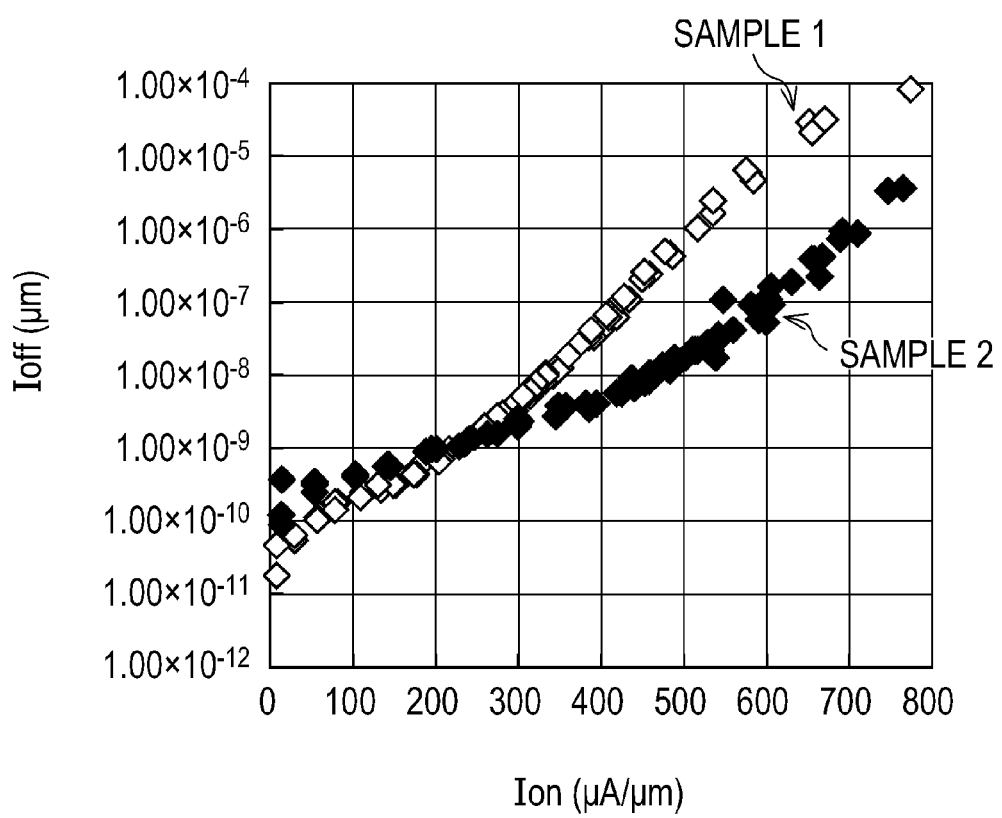
FIG. 8 is a plot of the $I_{on}$-$I_{off}$ curves of the MOS transistor according to the first embodiment.

FIG. 8 shows the $I_{on}$-$I_{off}$ curve ($I_{on}$: μA/μm, $I_{off}$: A/μm) of Sample 1. FIG. 8 shows that Sample 1 exhibited higher driving currents than Sample 2. Thus, the present embodiment may sufficiently produce an effect of full silicidation of the gate electrode. More specifically, when the off-state current $I_{off}$ was $1 \times 10^{-7}$ A/μm, the on-state current $I_{on}$ of Sample 1 was about 33% higher than that of Sample 2.

A method for manufacturing a MOS transistor according to a second embodiment will now be described.

Figure 9A:
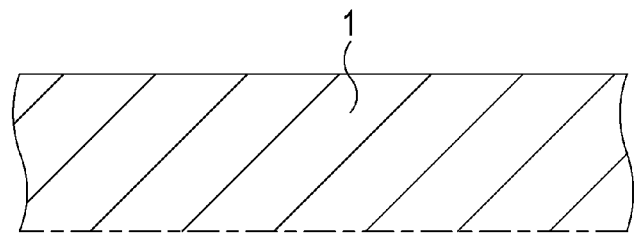
Figure 9B:
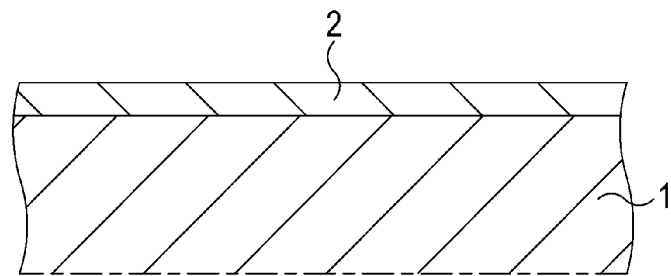
Figure 9C:
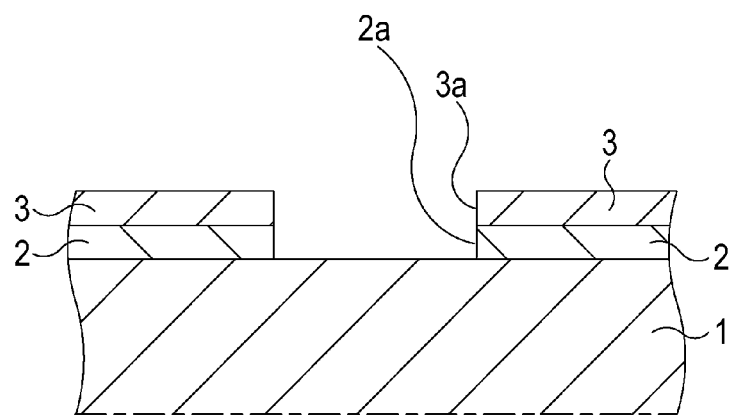

As illustrated in FIG. 9A, a semiconductor substrate 1 made of p-type single crystal silicon having a (100) plane surface is prepared. The semiconductor substrate 1 is washed with ammonia and hydrogen peroxide. Subsequently, the surface of the semiconductor substrate 1 is thermally oxidized to grow a silicon oxide layer 2 to a thickness of about 50 nm, as illustrated in FIG. 9B. A resist (not illustrated) is applied onto the silicon oxide layer 2, and the resist is subjected to lithography to form a resist mask 3 having an opening 3a in which the region where a well is to be formed is exposed, as illustrated in FIG. 9C. The silicon oxide layer 2 is etched through the resist mask 3 by a dry process to form an opening 2a in the silicon oxide layer 2, corresponding to the shape of the opening 3a.

Figure 10A:
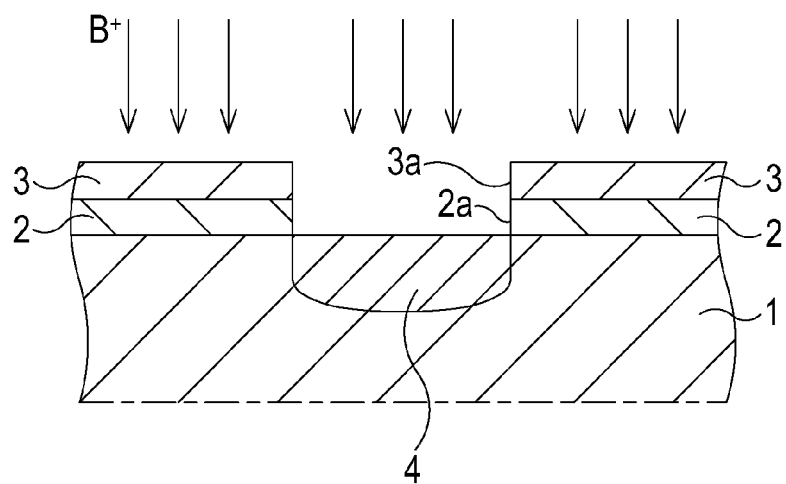

Turning now to FIG. 10A, a well 4 is formed in the surface of the semiconductor substrate 1. More specifically, the surface of the semiconductor substrate 1 exposed in the opening 2a of the silicon oxide layer 2 and the opening 3a of the resist mask 3 is doped, and the well 4 is thus formed in the surface of the semiconductor substrate 1. For forming a p-type well, for example, boron ($B^+$) ions are implanted in a dose of $1.0 \times 10^{13}$/cm² at an acceleration energy of 120 keV. For forming an n-type well, for example, phosphorus ($P^+$) ions are implanted in a dose of $1.0 \times 10^{13}$/cm² at an acceleration energy of 300 keV.

Figure 10B:
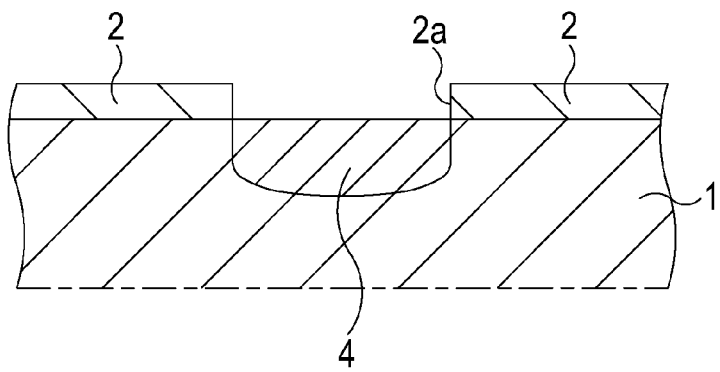
Figure 10C:
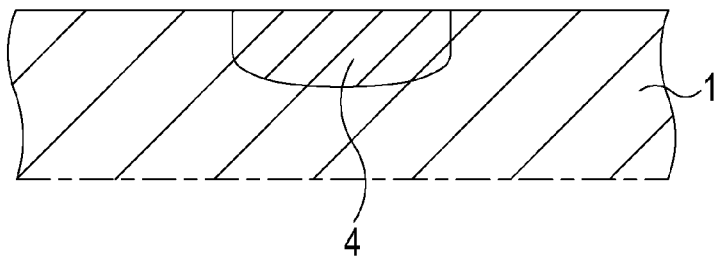
Figure 11A:
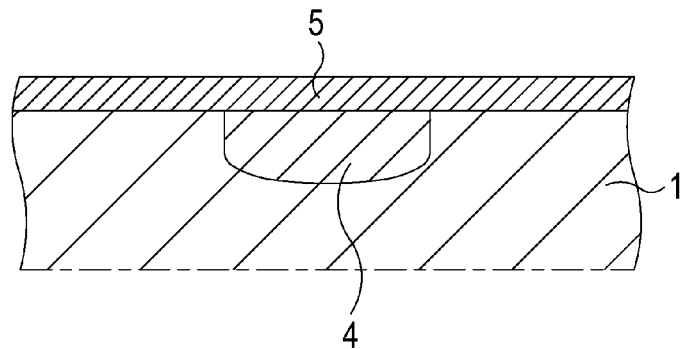

After the resist mask 3 is removed by ashing or the like as illustrated in FIG. 10B, the silicon oxide layer 2 is removed by wet etching, as illustrated in FIG. 10C. Turning now to FIG. 11A, a silicon nitride layer 5 is formed to a thickness of about 50 nm over the entire surface of the semiconductor substrate 1 by, for example, CVD.

Figure 11B:
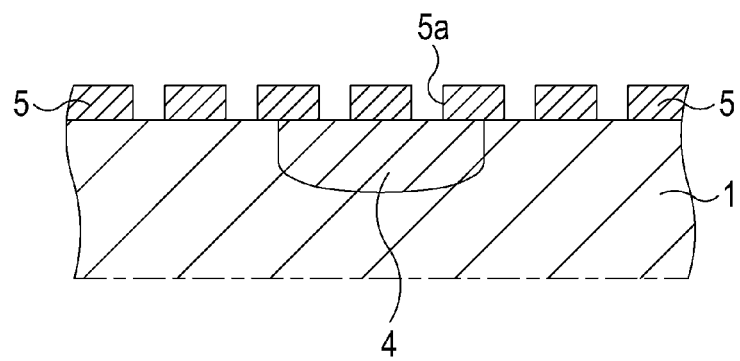

Then, the silicon nitride layer 5 is subjected to lithography and dry etching to form openings 5a therein, as illustrated in FIG. 11B. In each opening 5a, an element isolation region at the surface of the semiconductor substrate 1 is to be exposed.

Figure 11C:
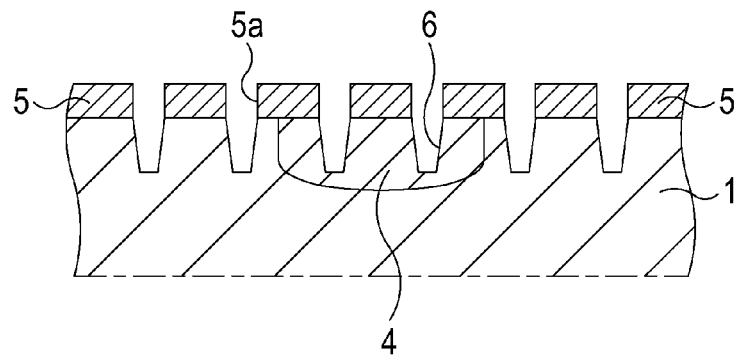

The regions at the surface of the semiconductor substrate 1 exposed in the openings 5a of the silicon nitride layer 5 are etched using the silicon nitride layer 5 as a mask by a dry process, thus forming isolation grooves 6 to a depth of, for example, about 400 nm, as illustrated in FIG. 11C.

Figure 12A:
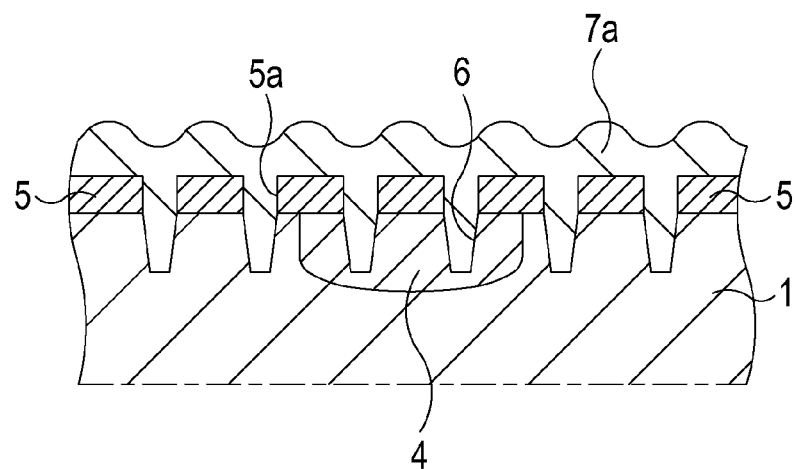
Figure 12B:
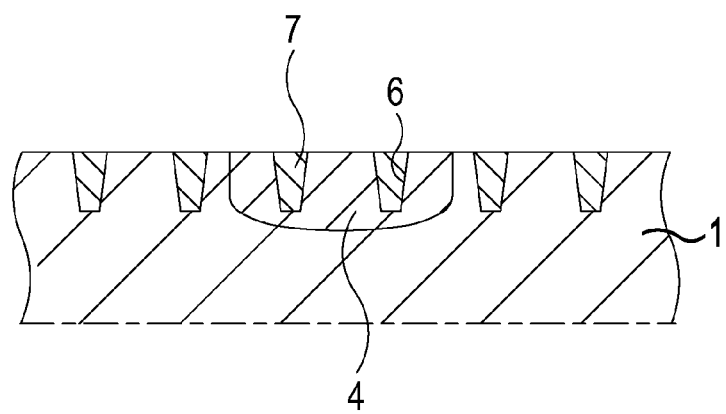

Turning now to FIG. 12A, shallow trench isolation structures (STI structures) 7 1 are formed to define active regions of the semiconductor substrate 1. More specifically, an insulating material, such as silicon oxide 7a, is deposited over the entire surface of the semiconductor substrate 1, for example, by CVD, thus filling the isolation grooves 6. The deposition of silicon oxide is polished to planarize, for example, by CMP until the surface of the silicon nitride layer 5 is exposed. Then, the silicon nitride layer 5 is removed by wet etching, as illustrated in FIG. 12B. The isolation grooves 6 are thus filled with silicon oxide to form the STI structures 7.

Figure 12C:
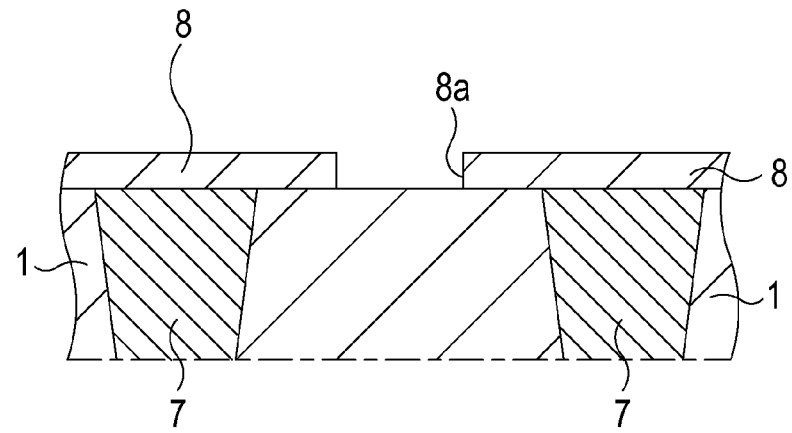
Figure 13A:
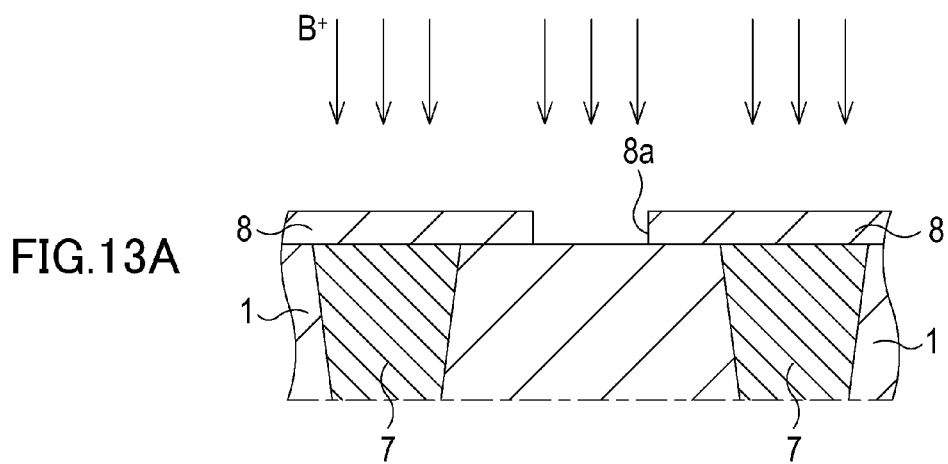

Turning to FIG. 12C, a resist (not illustrated) is applied onto the semiconductor substrate 1, and the resist is subjected to lithography to form a resist mask 8 having an opening 8a in which part of the active regions between the STI structures 7 are exposed. Subsequently, channel dose ion implantation is performed in the active regions of the semiconductor substrate 1 for controlling the threshold, as illustrated in FIG. 13A. For forming an n-type transistor, for example, boron ions ($B^+$) are implanted in a dose of $1.0 \times 10^{13}$/cm² at an acceleration energy of 15 keV. For forming a p-type transistor, for example, arsenic ions ($As^+$) are implanted in a dose of $1.0 \times 10^{13}$/cm² at an acceleration energy of 80 keV. After removing the resist mask 8 by ashing or the like, annealing is performed to activate the implanted dopant, for example, at 950° C. for 10 seconds.

Figure 13B:
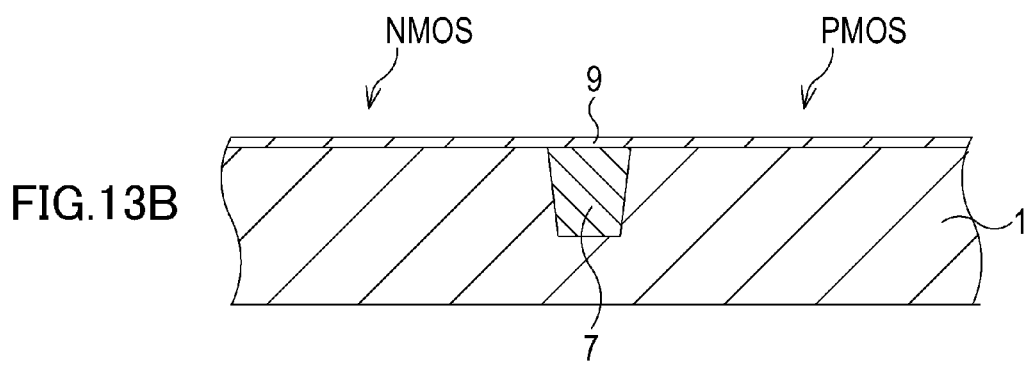

Then, a $SiO_2$ layer 9 is formed on the semiconductor substrate 1, as illustrated in FIG. 13B. In FIG. 13B and the subsequent figures, the left of the figures is the NMOS active region where the n-type MOS transistor is to be formed, and the right of the figures is the PMOS active region where the p-type MOS transistor is to be formed. For example, a SiO layer is formed to a thickness of about 0.5 nm to 1 nm, such as about 0.7 nm, by thermal CVD. The SiO layer is oxidized to the $SiO_2$ layer 9 in an oxidizing atmosphere including oxygen, such as of $O_3$, $O_2$ or oxynitride gas. As an alternative to the $SiO_2$ layer 9, a SiON layer may be formed by plasma annealing of the SiO layer and subsequent annealing at 750° C. to 1100° C.

Figure 13C:
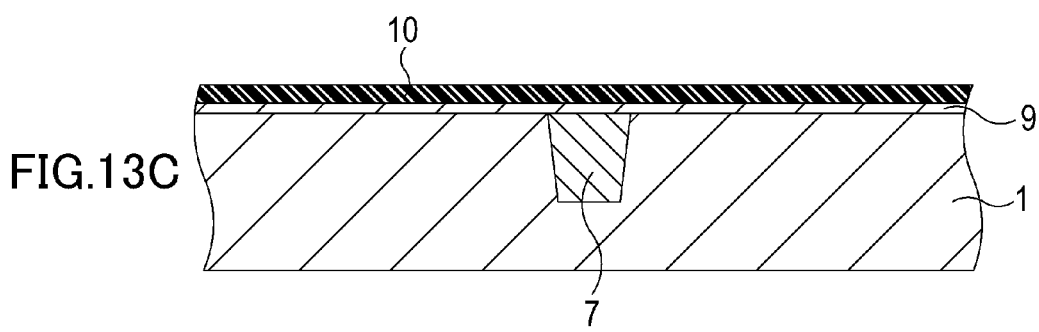

A HfSiO layer 10 is formed on the $SiO_2$ layer 9, as illustrated in FIG. 13C. More specifically, hafnium silicon oxide layer 10 is formed to a thickness of about 1 nm to 4 nm, such as about 1 nm, on the $SiO_2$ layer 9 by thermal CVD, atomic layer deposition (ALD) or physical vapor deposition (PVD). The hafnium silicon oxide layer 10 may contain at least one element selected from the group consisting of Zr, Ti, Al, Si, Ta, La, Y, and Mg. The completed hafnium silicon oxide layer 10 may be nitrided by $N_2$ plasma treatment and annealing at 750° C. to 1100° C.

Figure 14A:
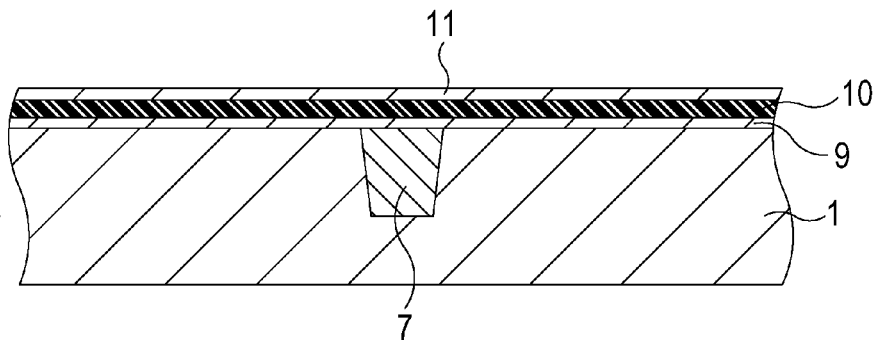

Turning to FIG. 14A, an aluminum oxide layer 11 is formed on the hafnium silicon oxide layer 10.

More specifically, the aluminum oxide layer 11 is formed to a thickness of about 0.3 nm to 1 nm, such as about 0.5 nm, on the hafnium silicon oxide layer 10 by thermal CVD, ALD, or PVD, thus depositing the material of dipoles of the p-type MOS transistor. As an alternative to the aluminum oxide layer 11, for example, a titanium oxide layer, a tantalum oxide layer or the like may be formed.

Figure 14B:
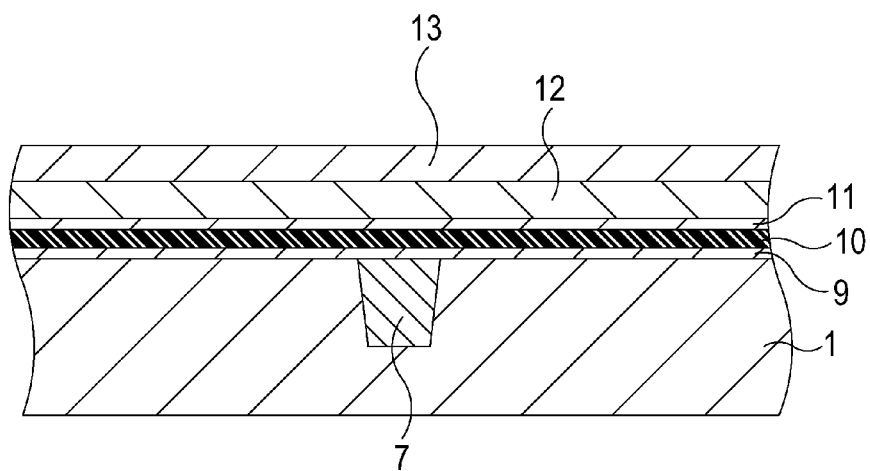

Subsequently, a TiN layer 12 and a SiN layer 13 are formed in that order, as illustrated in FIG. 14B. For example, the TiN layer 12 is formed to a thickness of about 10 nm to 50 nm, such as about 30 nm, on the aluminum oxide layer 11 by PVD. As an alternative to the single TiN layer 12, a multilayer film may be formed which includes the TiN layer and at least one other layer of WN, TiAlN, ZrN, HfN, $IrO_2$, PtRa, Ir, TaCN, Mo, MoN, $RuO_2$, Ru, and Pt. Alternatively, a multilayer film including at least two layers of WN, TiAlN, ZrN, HfN, $IrO_2$, PtRa, Ir, TaCN, Mo, MoN, $RuO_2$, Ru, or Pt may be formed.

Figure 14C:
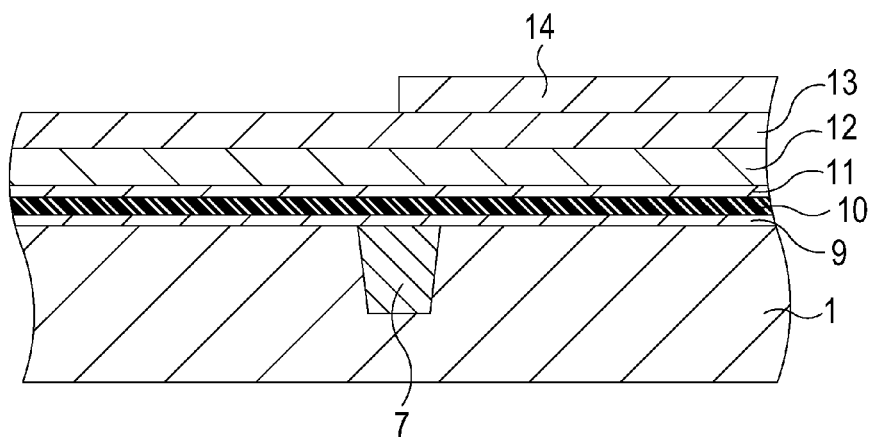

A resist mask 14 is formed to cover the PMOS active region, as illustrated in FIG. 14C. More specifically, a resist is applied onto the SiN layer 13, and the resist is subjected to lithography to form the resist mask 14 covering the PMOS active region.

Figure 15A:
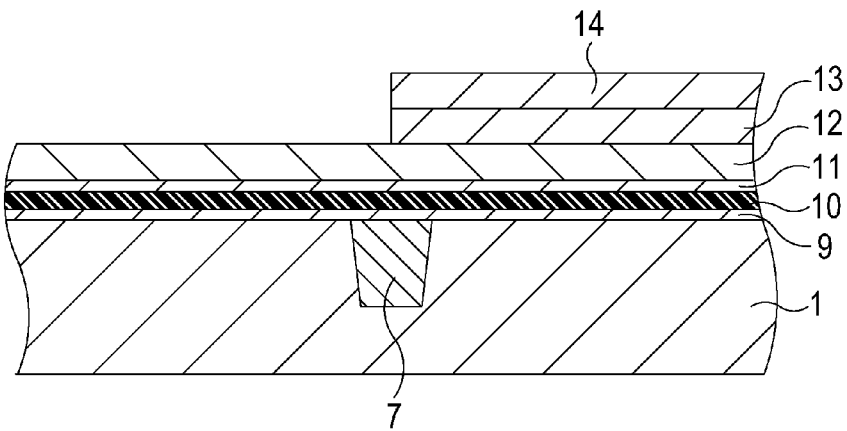
Figure 15B:
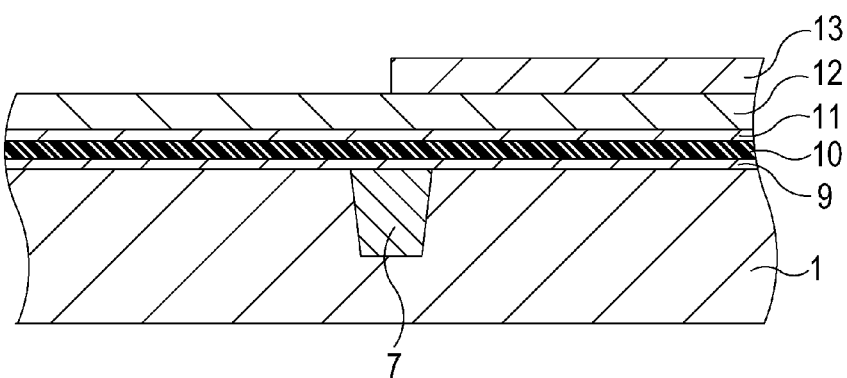
Figure 15C:
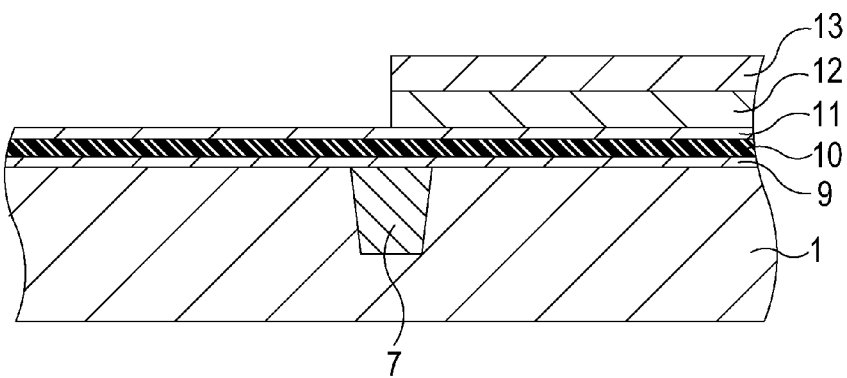

The SiN layer 13 is etched by a dry process through the resist mask 14 to remain on the PMOS active region, as illustrated in FIG. 15A. The resist mask 14 is removed by ashing or the like, as illustrated in FIG. 15B. Then, the TiN layer 12 is etched using the SiN layer 13 as a mask by a wet process with, for example, $H_2O_2$. The TiN layer 12 thus remains on the PMOS active region, as illustrated in FIG. 15C.

Figure 16A:
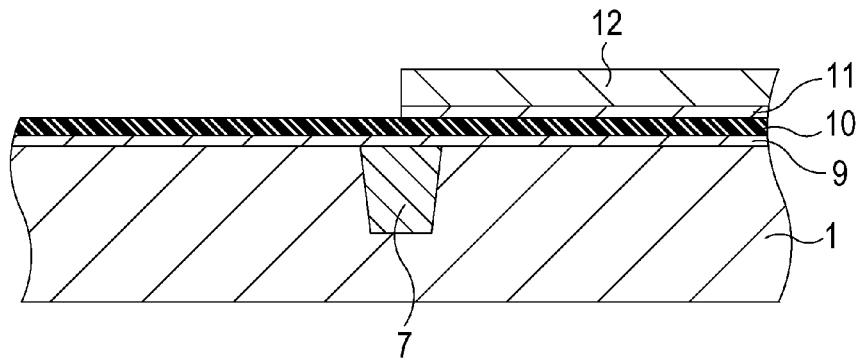
Figure 16B:
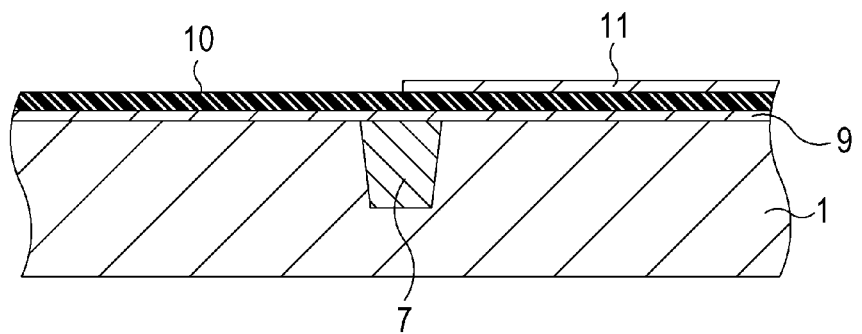

The aluminum oxide layer 11 is etched using the TiN layer 12 as a mask by a wet process with, for example, diluted hydrofluoric acid. The aluminum oxide layer 11 thus remains on the PMOS active region, as illustrated in FIG. 16A. The SiN layer 13 on the PMOS active region is removed simultaneously with the removal of the aluminum oxide layer 11 on the NMOS active region. At this time, the TiN layer 12 of the PMOS active region acts as a mask, and, thus, the aluminum oxide layer 11 remains on the PMOS active region. The TiN layer 12 is removed by wet etching using, for example, $H_2O_2$, as illustrated in FIG. 16B.

Figure 16C:
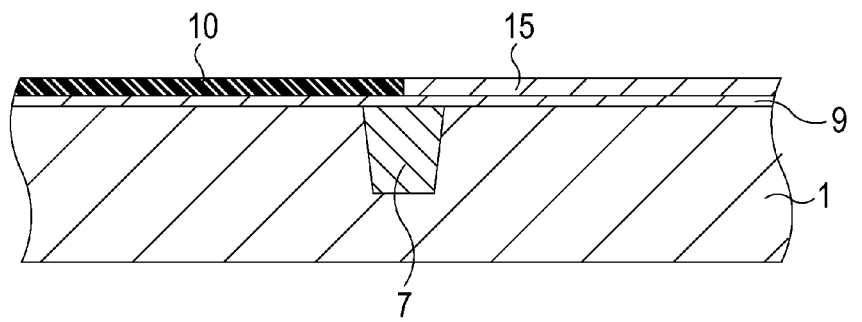

Then, a dipole layer 15 is formed for the p-type MOS transistor, as illustrated in FIG. 16C. More specifically, heat treatment is performed. For example, rapid thermal annealing (RTA) may be performed at a temperature of about 750° C. to 1100° C. for 5 seconds. Consequently, the aluminum in the aluminum oxide layer 11 is diffused into the hafnium silicon oxide layer 10 and reaches the interface between the hafnium silicon oxide layer 10 and the $SiO_2$ layer 9. The dipole layer 15 is thus formed. The dipole layer 15 controls the threshold of the p-type MOS transistor. A trace amount of nitrogen may be introduced to the dipole layer 15 so as to increase the dielectric constant slightly by $N_2$ plasma treatment before the above heat treatment. Instead of the heat treatment in this stage, the dipole layer 15 may be heat-treated simultaneously with the annealing performed later for activating the dopant in the source/drain regions.

Figure 17A:
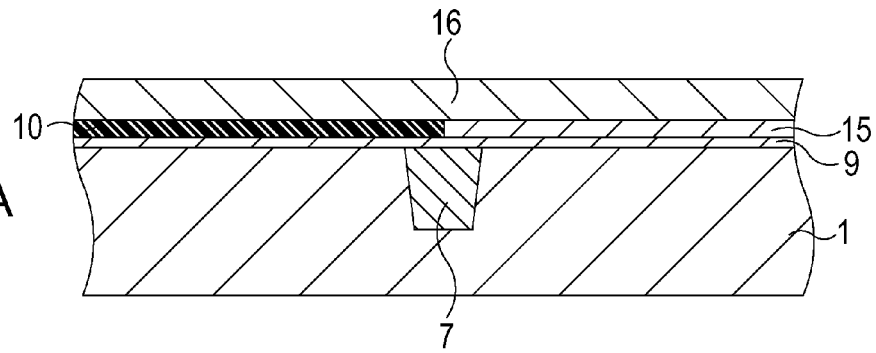

Turning now to FIG. 17A, a gate metal layer 16 is formed. For example, the gate metal layer 16 may be formed by depositing TiN to a thickness of about 0.5 nm to 30 nm, such as about 10 nm, by PVD, ALD, or CVD. If PVD is performed, the TiN layer is formed on the substrate with a temperature of −30° C. to 400° C. at an RF power of 0 W to 2000 W and a DC powder of 0 to 50000 W in a $N_2$ gas atmosphere or an $Ar+N_2$ gas atmosphere. As an alternative to the TiN single-layer gate metal layer 16, a multilayer film may be formed which includes the TiN layer and at least one other layer made of WN, TiAlN, ZrN, HfN, $IrO_2$, PtRa, Ir, TaCN, Mo, MoN, $RuO_2$, Ru, or Pt. Alternatively, a multilayer film including at least two layers made of WN, TiAlN, ZrN, HfN, $IrO_2$, PtRa, Ir, TaCN, Mo, MoN, $RuO_2$, Ru, or Pt may be formed. In this instance, the material of the gate metal layer 16 may have a work function suitable for the p-type MOS transistor, and may have a melting point of 2000° C. or more in bulk.

Figure 17B:
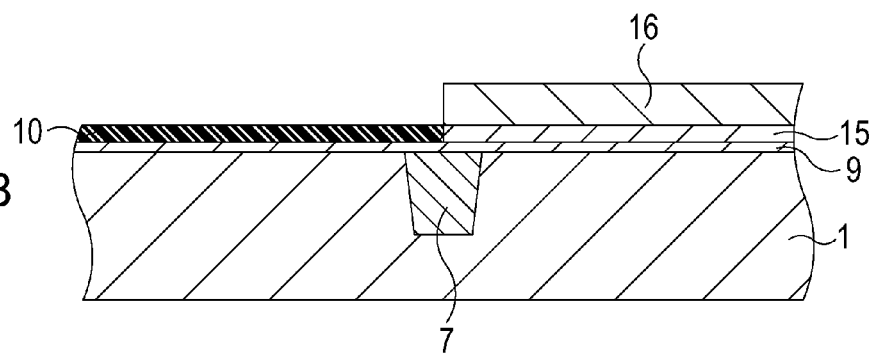

The gate metal layer 16 is worked so as to remain on the PMOS active region, as illustrated in FIG. 17B. More specifically, a SiN layer intended for a hard mask is formed, and then a resist is applied on the SiN layer. The resist is subjected to lithography to form a resist mask covering the PMOS active region. The SiN layer is removed from the NMOS active region by dry etching through the resist mask. Then, the resist is removed, and the SiN layer remaining on the PMOS active region is removed with diluted hydrofluoric acid.

Figure 17C:
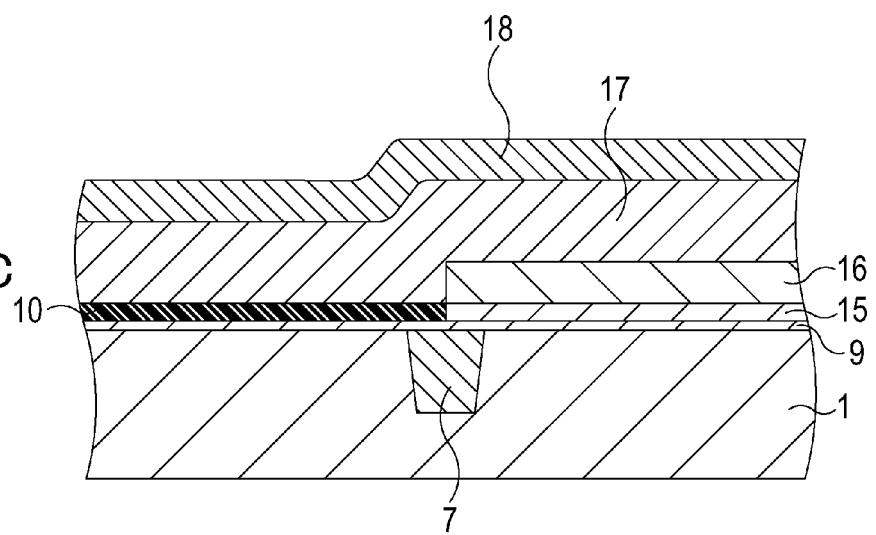

Subsequently, a polycrystalline silicon layer 17 and a SiN layer 18 are formed in that order over the entire surface of the substrate, as illustrated in FIG. 17C. For example, the polycrystalline silicon layer 17 is formed to a thickness of about 10 nm to 100 nm, such as about 50 nm, by thermal CVD. As an alternative to the polycrystalline silicon layer 17, an amorphous silicon layer may be formed. The SiN layer 18 may be formed to a thickness of about 5 nm to 100 nm, such as about 50 nm, for example, by CVD. The SiN layer 18 may not be formed.

Figure 18A:
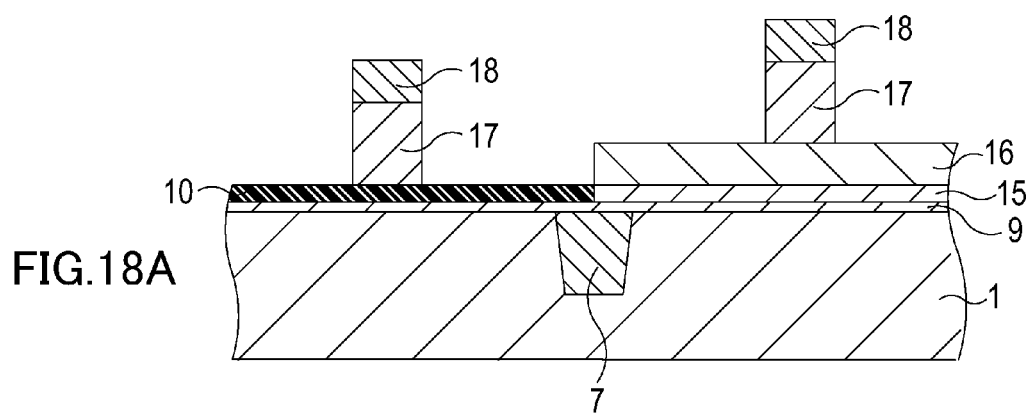

A polycrystalline silicon layer 17 and a SiN layer 18 are worked into an electrode shape, as illustrated in FIG. 18A. More specifically, a resist is applied onto the SiN layer 18, and is then worked into a resist mask having electrode shapes over the NMOS active region and the PMOS active region by lithography. The portions of the SiN layer over the NMOS active region and the PMOS active region are etched through the resist mask by a dry process. The resist mask is then removed, and the polycrystalline silicon layer 17 is etched by a dry process using the SiN layer 18 as a mask.

Figure 18B:
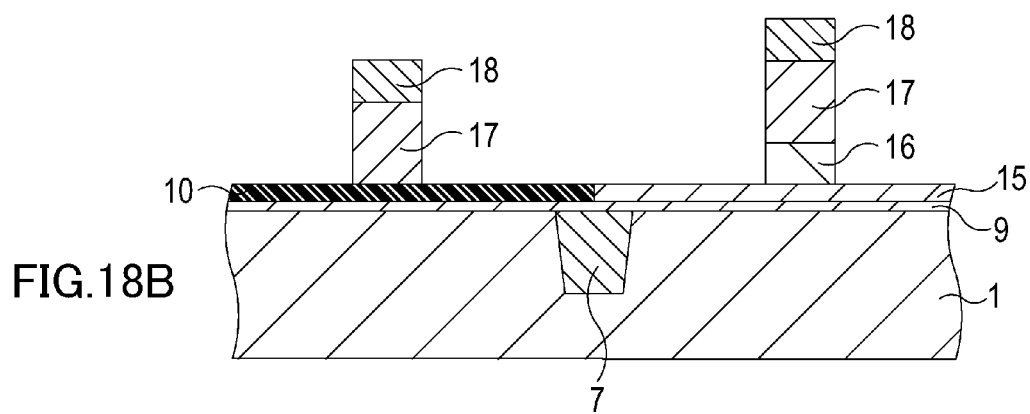

Turning to FIG. 18B, the gate metal layer 16 over the PMOS active region is etched using the SiN layer 18 as a mask. This etching is performed by dry etching, wet etching using $H_2O_2$, or both the dry etching and the $H_2O_2$ wet etching.

Figure 18C:
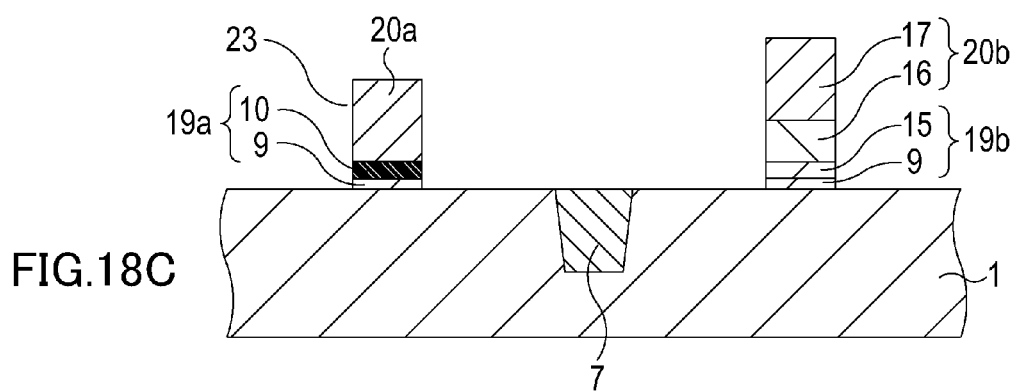

Gate electrodes 20a and 20b are formed on the NMOS active region and the PMOS active region respectively with the gate insulating layers 19a and 19b therebetween, as illustrated in FIG. 18C. More specifically, the hafnium silicon oxide layer 10, the dipole layer 15 and the $SiO_2$ layer 9 are etched by dry etching, wet etching with diluted hydrofluoric acid or nitric acid, or combined etching of dry etching and wet etching, using the SiN layer 18 as a mask. The SiN layer 18 is then removed by wet etching with diluted hydrofluoric acid. Thus, the gate electrode 20a including the polycrystalline silicon layer 17 is formed over the NMOS active region with the gate insulating layer 19a therebetween including the SiO$_2$ layer 9 and the hafnium silicon oxide layer 10. Also, the gate electrode 20b including the gate metal layer 16 and the polycrystalline silicon layer 17 is formed over the PMOS active region with the gate insulating layer 19b therebetween including the SiO$_2$ layer 9 and the dipole layer 15.

Figure 19A:
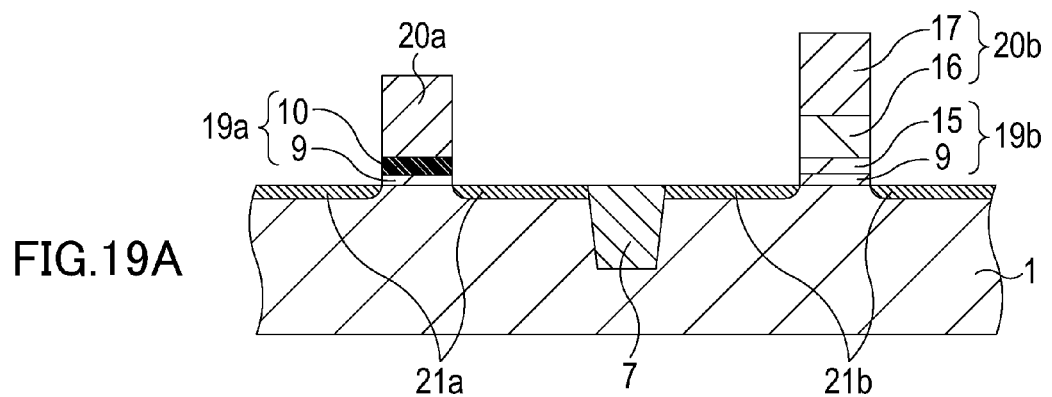

Turning now to FIG. 19A, extension regions 21a and 21b are formed in the surface of the semiconductor substrate 1.

More specifically, the regions at the surface of the semiconductor substrate 1 at both sides of the gate electrodes 20a and 20b are doped using the gate electrodes 20a and 20b as a mask to form the extension regions 21a and 21b. For preparing a p-type MOS transistor, the NMOS active region is covered with a resist mask, and, for example, boron ions (B$^+$) are implanted in the PMOS active region in a dose of $1.0 \times 10^{15}/cm^2$ at an acceleration energy of 0.5 keV to form the extension region 21b. For preparing an n-type MOS transistor, the PMOS active region is covered with a resist mask, and, for example, arsenic ions (As$^+$) are implanted in the NMOS active region in a dose of $1.0 \times 10^{15}/cm^2$ at an acceleration energy of 1 keV to form the extension region 21a.

Figure 19B:
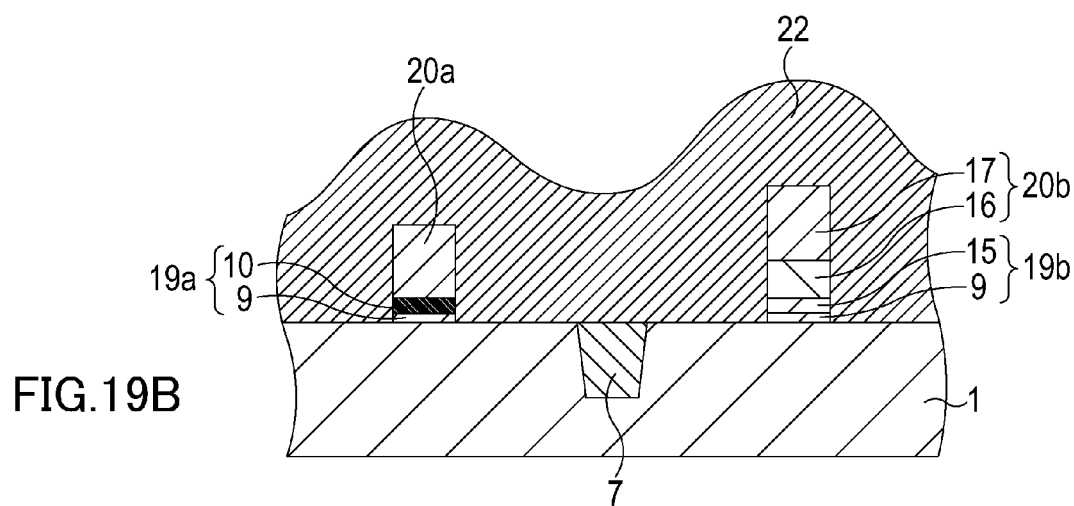
Figure 19C:
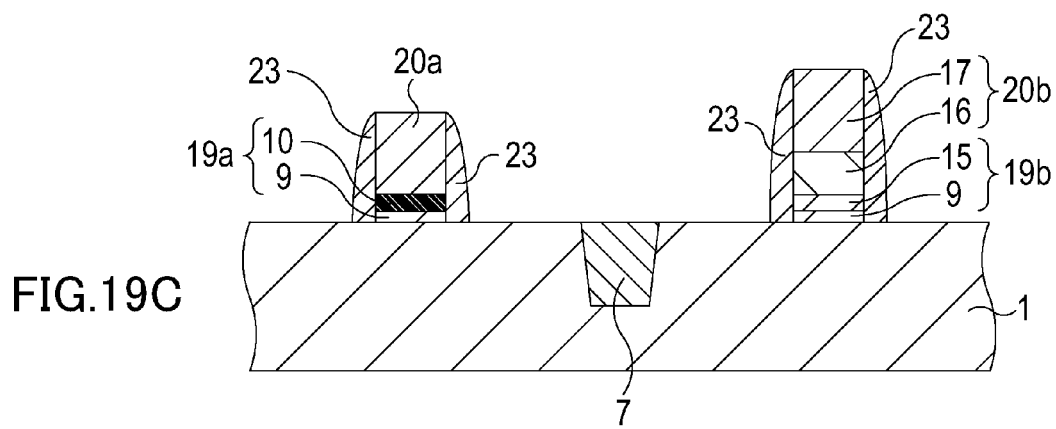

Subsequently, an insulating layer is formed over the entire surface of the semiconductor substrate 1 including the gate electrodes 20a and 20b, as illustrated in FIG. 19B. In the present embodiment, a silicon oxide layer 22 is formed to a thickness of about 100 nm by, for example, CVD. The entire surface of the silicon oxide insulating layer 22 is subjected to anisotropic dry etching by reactive ion etching (RIE) so as to remain at both sides of the gate electrodes 20a and 20b. Thus, side wall insulating films 23 are formed as illustrated in FIG. 19C.

Figure 20A:
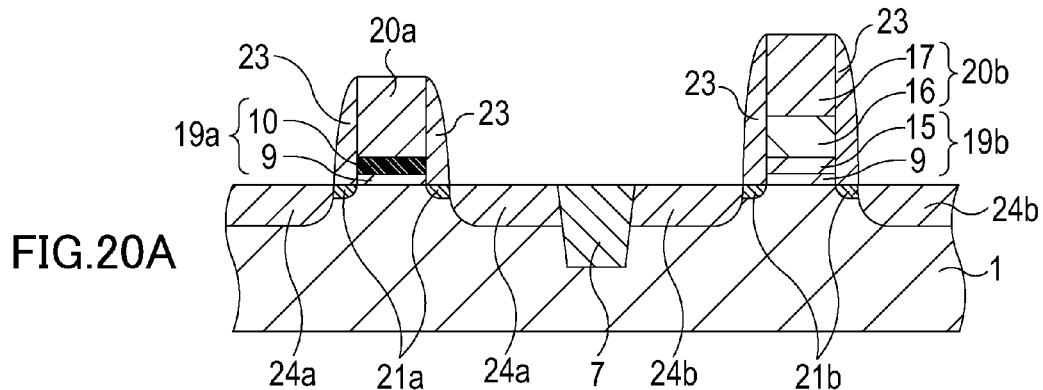

Turning to FIG. 20A, source/drain regions 24a and 24b partially overlapping with the extension regions 21a and 21b are formed in the surface of the semiconductor substrate 1. More specifically, the source/drain regions 24a and 24b are formed by doping the surface of the semiconductor substrate 1 at both sides of the gate electrodes 20a and 20b with the side wall insulating films 23 using the gate electrodes 20a and 20b and the side wall insulating films 23 as a mask. For preparing a p-type MOS transistor, the NMOS active region is covered with a resist mask, and, for example, boron ions (B$^+$) are implanted in a dose of $5.0 \times 10^{15}/cm^2$ at an acceleration energy of 5 keV to form the source/drain regions 24b. For preparing an n-type MOS transistor, the PMOS active region is covered with a resist mask, and, for example, phosphorus ions (P$^+$) are implanted in a dose of $1.0 \times 10^{16}/cm^2$ at an acceleration energy of 8 keV to form the source/drain regions 24a. The dopant is activated by annealing at a temperature of, for example, 1025° C. for 3 seconds.

Figure 20B:
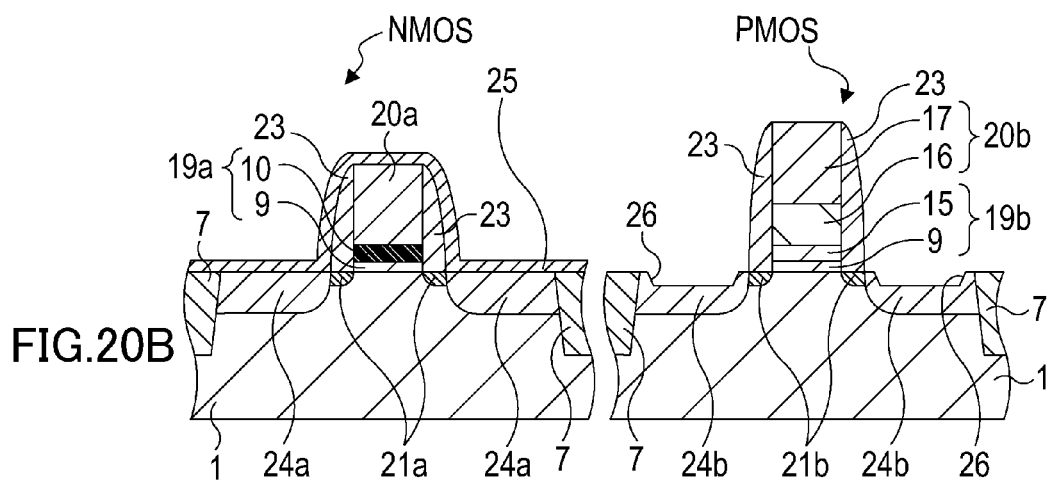

Recesses 26 are formed in the surfaces of the source/drain regions 24b in the PMOS active region, as illustrated in FIG. 20B. A silicon oxide layer 25 is formed to a thickness of about 40 nm over the entire surface of the semiconductor substrate 1 by, for example, CVD. The silicon oxide layer 25 is subjected to lithography and dry etching. Consequently, the portions of the silicon oxide layer 25 over the PMOS active region and the STI element isolation region 7 defining the PMOS active region 7 are removed, and the portions of the silicon oxide layer 25 over the NMOS active region and the STI element isolation region 7 defining the NMOS active region remain on the semiconductor substrate 1. The PMOS active region is etched by RIE with a high selectivity to the silicon oxide layer 25 using the silicon oxide layer 25 as a mask. The recesses 26 are thus formed to a depth of about 50 nm in the source/drain regions 24b at both sides of the gate electrode 20b with the side wall insulating film 23. In this step, the surface of the gate electrode 20b is also etched slightly. The surface of the semiconductor substrate 1 having the recesses 26 is cleaned with dilute hydrofluoric acid, for example, for 5 seconds. The hydrofluoric acid includes HF and H$_2$O in a proportion, for example, of 5:100.

Figure 20C:
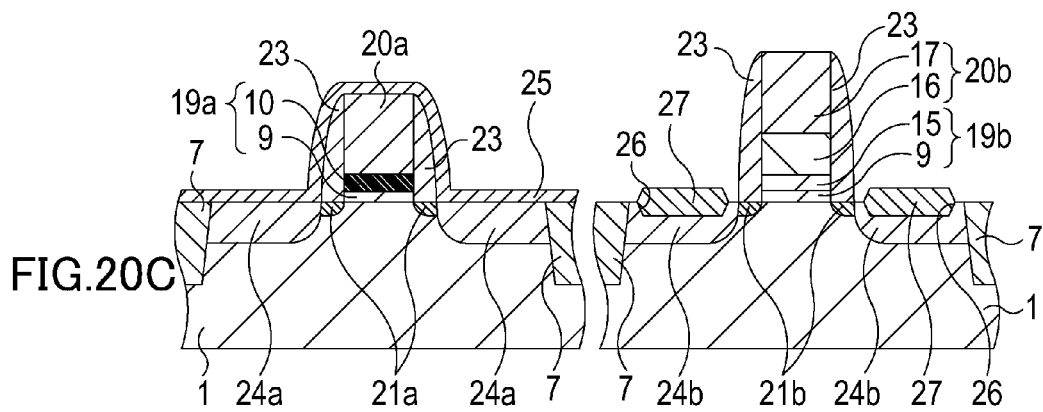

Silicon germanium films (Si$_{1-x}$Ge$_x$ layer, 0<x<1) 27 are formed in the recesses 26, as illustrated in FIG. 20C. More specifically, a doped Si$_{1-x}$Ge$_x$ film 27 is epitaxially grown to a thickness of, for example, about 60 nm in each recess 26 by, for example, CVD using the silicon oxide layer 25 as a mask. The dopant of the Si$_{1-x}$Ge$_x$ film 27 may be boron. The Si$_{1-x}$Ge$_x$ layer 27 may have a composition expressed by Si$_{0.76}$Ge$_{0.24}$. The Si$_{1-x}$Ge$_x$ layer 27 may be formed using a mixture of GeH$_4$, SiH$_4$ and B$_2$H$_6$ gases as the material gas at a temperature of 550° C. The partial pressures of GeH$_4$, SiH$_4$ and B$_2$H$_6$ are 0.3 Pa, 6 Pa and 0.00001 Pa, respectively. The compositional fraction x of Ge in the Si$_{1-x}$Ge$_x$ layer 27 is not limited to 0.24. The Ge compositional fraction x may be set as desired in the range of 0<x<1. The Si$_{1-x}$Ge$_x$ films 27 are thus embedded in the recesses 26 in the source/drain regions 24b of the PMOS active region. In this step, the Si$_{1-x}$Ge$_x$ film is formed on the upper surface of the gate electrode 20b as well (but not illustrated in the figure).

Figure 21A:
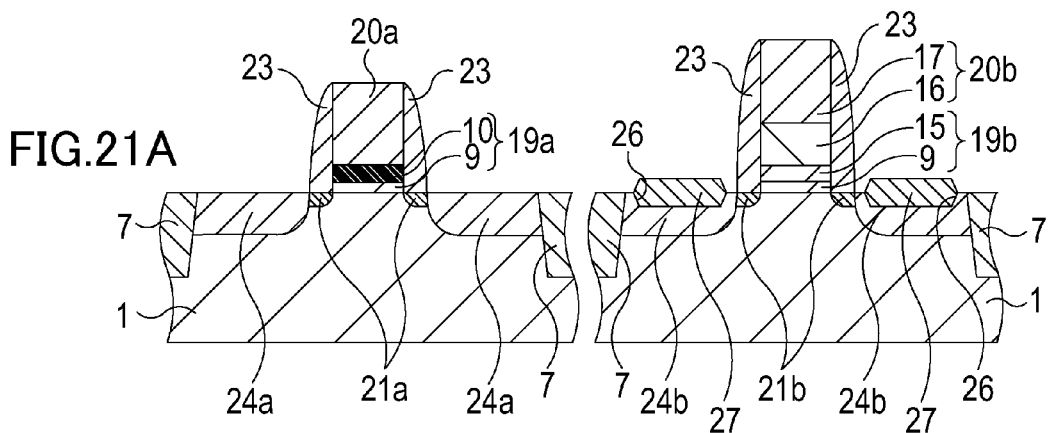

The silicon oxide layer 25 disposed over the NMOS active region is removed with, for example, hydrofluoric acid, as illustrated in FIG. 21A. The Si$_{1-x}$Ge$_x$ films 27 have been embedded in the source/drain regions 24b of the PMOS active region. Si$_{1-x}$Ge$_x$ has a higher lattice constant than Si. Accordingly, a compressive strain is applied to the channel region of the p-type MOS transistor to increase the hole mobility.

Figure 21B:
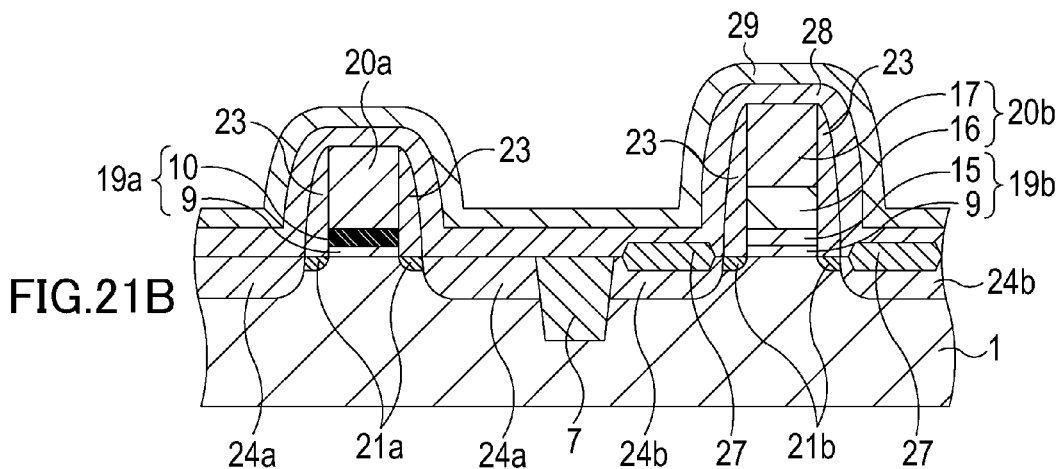

A NiPt layer 28, which is to be silicided, and a cap layer 29 are formed in that order, as illustrated in FIG. 21B. More specifically, naturally oxidized films formed on the gate electrodes 20a and 20b and the source/drain regions 24a and 24b are removed by treatment with hydrofluoric acid. As an alternative to the hydrofluoric acid treatment, Ar sputtering may be performed to physically remove the naturally oxidized films. Alternatively, the naturally oxidized films may be removed by chemical treatment for reduction using nitrogen trifluoride (NF$_3$) gas plasma or H$_2$ gas plasma. For this chemical treatment, for example, (NH$_4$)$_2$SiF$_6$ is produced from NF$_3$ gas and NH$_3$ gas, and further Ar gas or H$_2$ gas by remote plasma, followed by sublimating. The naturally oxidized films may thus be removed by reduction.

A Ni target, which is a target of a siliciding metal, is prepared. This target includes Ni and at least one element selected from the group consisting of Pt, Ta, W, Re, Y, Yb, Al, La, and Ti. In the present embodiment, the target includes Pt, hence being made of NiPt. The Pt content in the target is 1 at. % to 10 at. %, preferably 2 at. % to 10 at. %. In the present embodiment, the Pt content is 5 at. %.

A NiPt layer 28 is formed to a thickness of about 5 nm to 20 nm over the entire surface of the semiconductor substrate 1 including the gate electrodes 20a and 20b and the side wall insulating films 23 by sputtering using the NiPt target. In the present embodiment, the NiPt layer is deposited to a thickness of about 20 nm. As an alternative to sputtering, the NiPt layer may be formed by electron beam vapor deposition.

The NiPt layer 28 may be covered with a cap layer 29 formed by depositing TiN to a thickness of about 5 nm to 50 nm by, for example, sputtering. The cap layer 29 may be formed by depositing Ti to a thickness of about 5 to 30 nm.

Figure 21C:
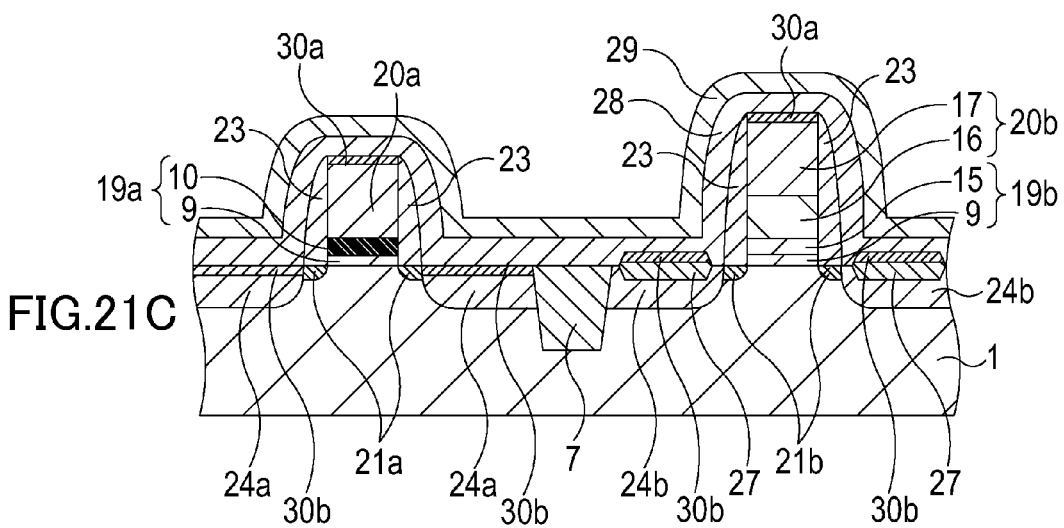

Turning now to FIG. 21C, the surface layers of the gate electrodes 20a and 20b and the surface layers of the source/drain regions 24a and 24b are silicided into (NiPt)$_2$Si layers 30a and 30b. More specifically, annealing (first annealing) is performed at a temperature of 300° C. or less, for example, 200° C. to 290° C. In the present embodiment, the annealing is performed at 270° C. for about 60 seconds to 300 seconds. By this annealing, the surface layers of the gate electrodes 20a and 20b and the surface layers of the source/drain regions 24a and 24b are silicided. Thus, the (NiPt)$_2$Si layers 30a are respectively formed at the surfaces of the gate electrodes 20a and 20b, and the (NiPt)$_2$Si layers 30b are respectively formed at the surfaces of the source/drain regions 24a and 24b. A Pt-rich (NiPt)$_2$Si layer (not illustrated) is formed at the surface of each of the (NiPt)$_2$Si layers 30a and 30b. The first annealing may be conducted by furnace annealing or a combination of furnace annealing and rapid heating.

Figure 22A:
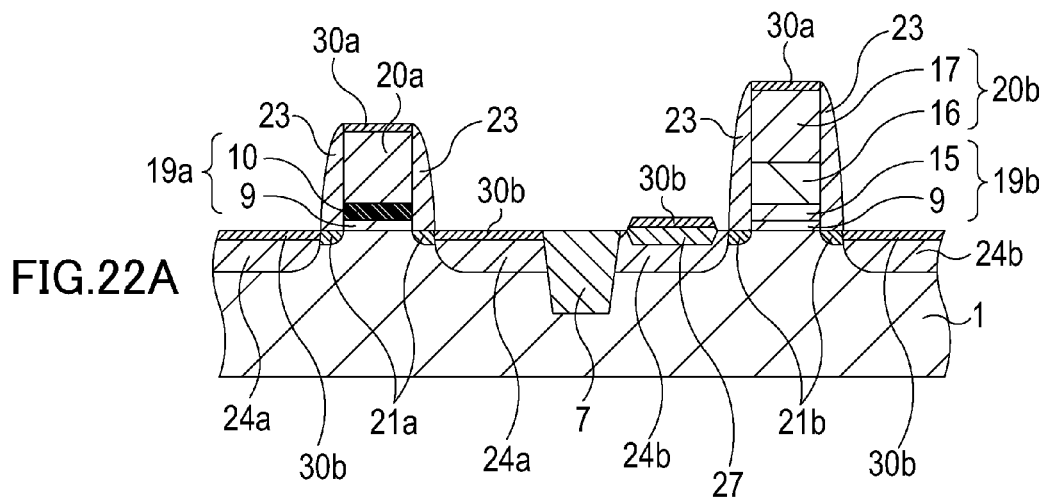

Turning to FIG. 22A, the cap layer 29 and the unreacted NiPt layer 28 are selectively removed by chemical treatment using an SPM solution. As an alternative to the SPM solution, a mixed solution of hydrochloric acid and hydrogen peroxide water may be used.

Figure 22B:
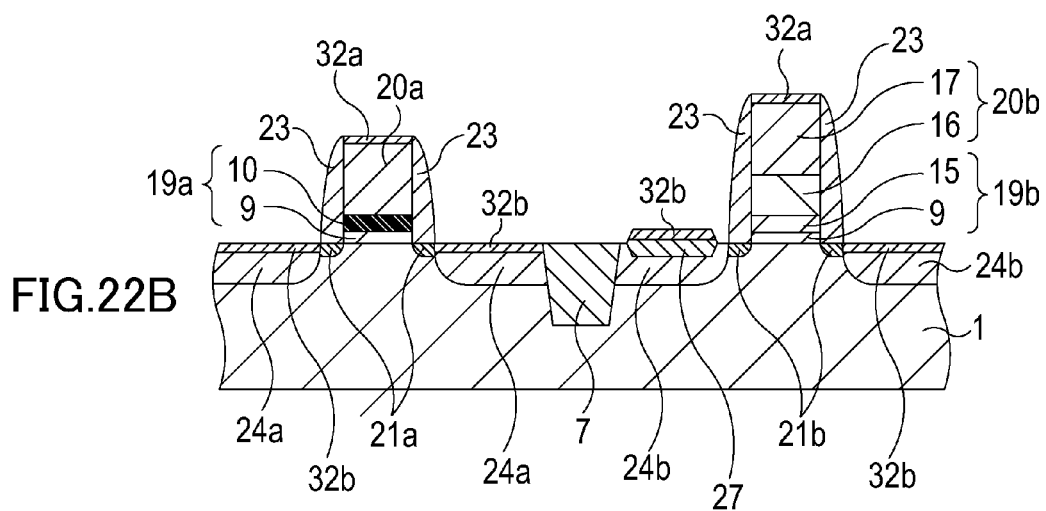

The surface layers of the gate electrodes 20a and 20b and the surface layers of the source/drain regions 24a and 24b are silicided again into (NiPt)Si layers 32a and 32b, as illustrated in FIG. 22B. More specifically, rapid annealing (second annealing) is performed at a temperature of 350° C. to 600° C., such as 400° C., for 10 seconds to 120 seconds, such as 30 seconds. By this rapid annealing, the surface layers of the gate electrodes 20a and 20b and the surface layers of the source/drain regions 24a and 24b are silicided, so that the (NiPt)$_2$Si layers 30a and 30b are converted to the (NiPt)Si layers 32a and 32b.

Figure 22C:
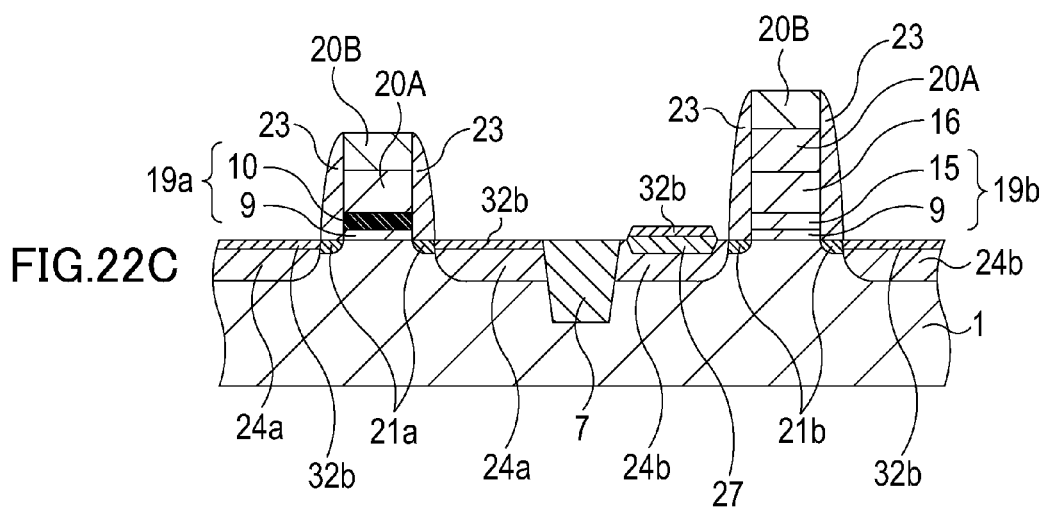

The semiconductor substrate 1 in the state illustrated in FIG. 22B is subjected to msec annealing. In the present embodiment, flash lamp annealing (first flash lamp annealing) is performed. This msec annealing selectively silicides the gate electrodes 20a and 20b while the (NiPt)Si layers 32b are maintained in the source/drain regions 24a and 24b. Consequently, for example, about 90 percent of the plurality of gate electrodes 20a and 20b are fully silicided into (NiPt)Si$_2$. On the other hand, the other 10 percent are silicided in such a manner that a Si layer 20B remains at the top of each gate electrode while the portion under the Si layer 20B is silicided into a (NiPt)Si$_2$ layer 20A. FIG. 22C shows the gate electrodes 20a and 20b in which the Si layer 20B remains at the top thereof.

The source/drain regions 24a and 24b have a structure from which the heat of the first flash lamp annealing may easily be released while the gate electrodes 20a and 20b have a structure from which the heat may not be easily released. The gate electrodes 20a and 20b are respectively enclosed with the gate insulating layer 19a and 19b and the side wall insulating films 23. When the first flash lamp annealing is performed, the gate electrodes 20a and 20b are heated with these silicon oxide films keeping the temperature of the gate electrodes 20a and 20b. Thus, the structure of the gate electrodes 20a and 20b facilitates silicidation. On the other hand, the source/drain regions 24a and 24b allow heat to dissipate easily in the depth direction of the semiconductor substrate 1. Accordingly, the source/drain regions 24a and 24b are hardly heated in comparison with the gate electrodes 20a and 20b, and thus silicidation does not proceed. Si has a thermal conductivity of 148 W/mK (35.3×10$^{-2}$ cal/(cm·s·° C.), and SiO$_2$ has a thermal conductivity of 2.55×10$^{-2}$ cal/(cm·s·° C.) (in the C-axis direction) and 1.48×10$^{-2}$ cal/(cm·s·° C.) (in the direction perpendicular to the C-axis direction). Although the side wall insulating films 23 are formed of silicon oxide in the present embodiment, they may be formed of other insulating materials, such as silicon nitride, and may have a multilayer structure including, for example, a silicon oxide layer and a silicon nitride layer. Such side wall insulating films may suppress the heat of the gate electrodes from dissipating.

The first flash lamp annealing is performed at an irradiation energy in range of 24 J/cm$^2$ to 28 J/cm$^2$ at an assist temperature in the range of 300° C. to 450° C. for an irradiation time in the range of 0.5 ms to 1.5 ms. In the present embodiment, the first flash lamp annealing is performed at an assist temperature of 450° C. at an irradiation energy of 24 J/cm$^2$ for an irradiation time of 0.8 ms. By the first flash lamp annealing, the Pt in each initially formed (NiPt)Si layer on the Si layers 20B of the gate electrodes 20a and 20b is dissolved in the solid and diffused widely in the Si layer 20B.

The assist temperature is set in the range of the temperatures of rapid annealing described with reference to FIG. 22B. Accordingly, the annealing in FIG. 22B and the first flash lamp annealing may be continuously performed in a flash lamp annealing apparatus. In the present embodiment, laser annealing may be performed as msec annealing, instead of flash lamp annealing.

The Si layers 20B exposed at the top of the gate electrodes 20a and 20b are silicided. This silicidation is also performed on CMOS transistors whose gate electrode is fully silicided by the above-described flash lamp annealing.

Naturally oxidized films formed on the gate electrodes 20a and 20b and the source/drain regions 24a and 24b are removed. If wet etching is performed with hydrofluoric acid in this step, the (NiPt)Si layers 32b of the source/drain regions 24a and 24b are also etched undesirably. Accordingly, the naturally oxidized films are removed, for example, by Ar sputtering with ICP plasma. The Ar sputtering is performed to a depth, for example, of about 2 to 4 nm in terms of the thickness of the naturally oxidized silicon oxide film. Alternatively, the naturally oxidized film may be removed by chemical treatment for reduction using nitrogen trifluoride (NF$_3$) gas plasma or H$_2$ gas plasma, instead of Ar sputtering. For this chemical treatment, for example, (NH$_4$)$_2$SiF$_6$ is produced from NF$_3$ gas and NH$_3$ gas, and further Ar gas or H$_2$ gas by remote plasma, followed by sublimating. The naturally oxidized film may thus be removed by reduction.

Figure 23A:
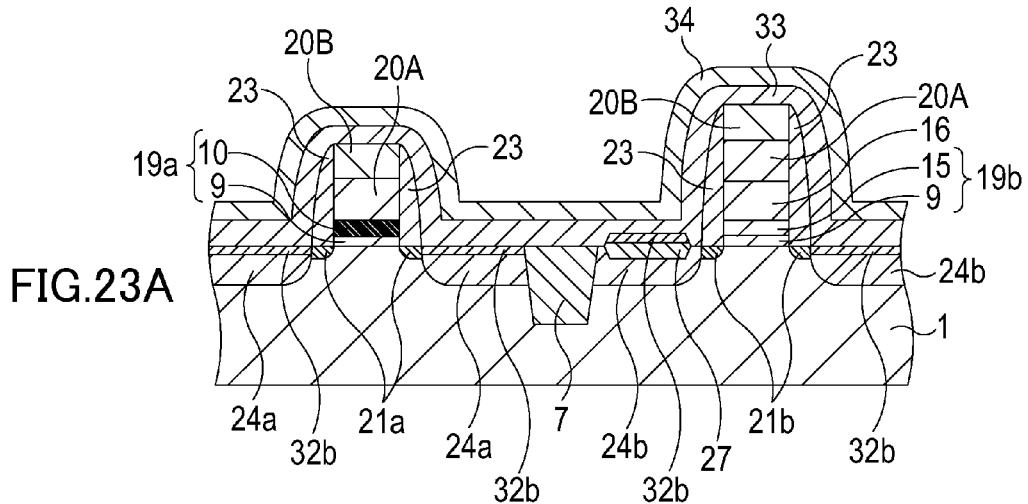

A NiPt layer 33, which is to be silicided, and a cap layer 34 are formed in that order over the semiconductor substrate 1, as illustrated in FIG. 23A. A Ni or Ni alloy target, which is a target of a siliciding metal, is prepared. The Ni alloy target includes Ni and at least one element selected from the group consisting of Pt, Ta, W, Re, Y, Yb, Al, La, and Ti. In the present embodiment, a NiPt target including Pt is used as the target. The Pt content in the target is 1 to 10 at. %, preferably 2 to 10 at. %, such as 5 at. %. A NiPt layer 33 is formed to a thickness of about 5 to 100 nm over the entire surface of the semiconductor substrate 1 including the gate electrodes 20a and 20b with the side wall insulating films 23 by sputtering using the NiPt target. In the present embodiment, the NiPt layer is deposited to a thickness of about 9 nm. As an alternative to sputtering, the NiPt layer 33 may be formed by electron beam vapor deposition.

The NiPt layer 33 may be covered with a cap layer 34 formed by depositing TiN to a thickness of about 5 nm to 50 nm, such as about 10 nm, for example, by sputtering. The cap layer 34 may be formed by depositing Ti to a thickness of about 5 nm to 30 nm.

Figure 23B:
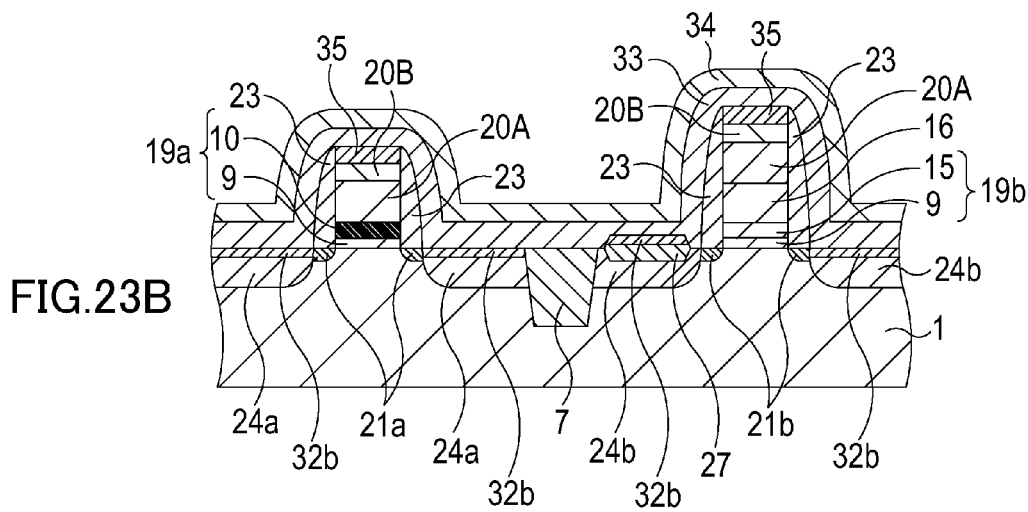

Turning now to FIG. 23B, the Si layers 20B exposed at the top of the gate electrodes 20a and 20b are silicided into (NiPt)Si layers 35. The following description will describe the case where the (NiPt)Si layer 35 is formed at the upper portion of the Si layer 20B. Annealing (third annealing) is performed at a temperature in the range of 200° C. to 600° C., preferably in the range of 200° C. to 450° C., such as 400° C., for example, for 30 seconds. The (NiPt)Si layers 32b of the source/drain regions 24a and 24b each have a Pt-rich layer at the upper surface thereof. This Pt-rich layer suppresses the increase of the thickness of the (NiPt)Si layer even though the annealing is performed. On the other hand, the Si layers 20B of the gate electrodes 20a and 20b do not include segregated Pt, and may accordingly react to form a silicide. The annealing in this step may be performed at a temperature of about 200° C. to 290° C. so that the upper surfaces of the gate electrodes 20a and 20b are converted to (Ni$_2$Pt)Si, and then further annealing is performed at 400° C. so that the upper portions of the gate electrodes 20a and 20b are converted to (NiPt)Si layers.

Figure 23C:
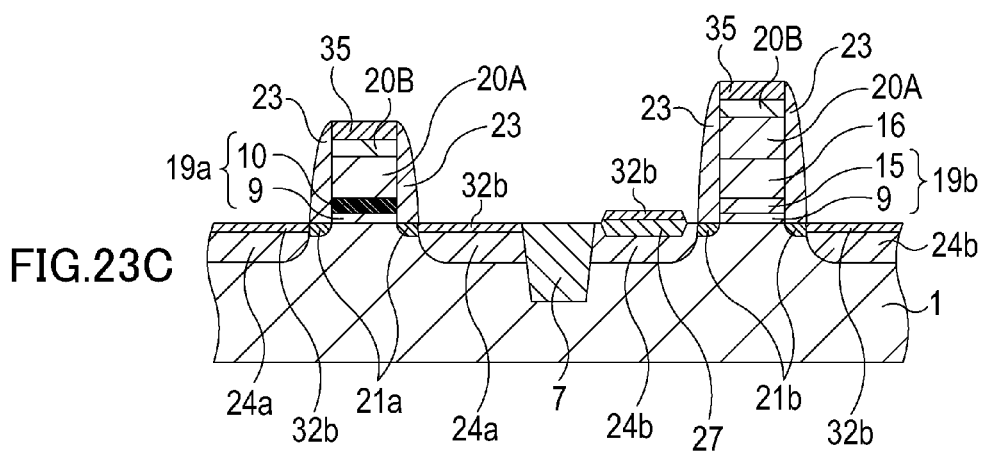

Turning to FIG. 23C, the cap layer 34 and the unreacted NiPt layer 33 are removed. More specifically, the cap layer 34 and the unreacted NiPt layer 33 are selectively removed by chemical treatment using an SPM solution. As an alternative to the SPM solution, a mixed solution of hydrochloric acid and hydrogen peroxide water may be used.

The semiconductor substrate 1 in the state illustrated in FIG. 23C is subjected to msec annealing. In the present embodiment, flash lamp annealing (second flash lamp annealing) is performed, as illustrated in FIG. 24A. This msec annealing selectively silicides the gate electrodes 20a and 20b while the (NiPt)Si layers 32b are maintained in the source/drain regions 24a and 24b. As a result, the gate electrodes 20a and the portion of the gate electrode 20b other than the gate metal layer 16 are fully silicided into (NiPt)Si$_2$ to form fully silicided gate electrodes 36a and 36b. Although the fully silicided gate electrode 36b is formed by fully siliciding the portion of the gate electrode 20b other than the gate metal layer 16, the fully silicided gate electrode 36b is represented by both the gate metal layer 16 and the fully silicided portion 31 in the figure for the sake of convenience. Since the amount of Ni supplied to the gate electrode 20a and the fully silicided portion 31 is sufficient to form Ni(Pt)Si$_2$ with respect to the amount of Si in the gate electrode 20a and the fully silicided portion 31, the gate electrode 20a and the fully silicided portion 31 are fully silicided uniformly into (NiPt)Si$_2$.

The second flash lamp annealing is performed at an irradiation energy in range of 24 J/cm$^2$ to 28 J/cm$^2$ at an assist temperature in the range of 300° C. to 450° C. for an irradiation time in the range of 0.5 ms to 1.5 ms. In the present embodiment, the second flash lamp annealing is performed at an assist temperature of 450° C. at an irradiation energy of 24 J/cm$^2$ for an irradiation time of 0.8 ms.

Turning to FIG. 24B, a silicon nitride layer 37 is formed over the NMOS active region, and a silicon nitride layer 38 is formed over the PMOS active region. The silicon nitride layers 37 and 38 are formed to a thickness of about 50 nm at a temperature of 400° C. by, for example, CVD so as to cover the entire surfaces of the fully silicided gate electrodes 36a and 36b with the side wall insulating films 23. The silicon nitride layers 37 and 38 are so-called dual stress liner films.

For preparing a p-type MOS transistor, a silicon nitride layer 37 having a compressive stress is formed. For preparing an n-type MOS transistor, a silicon nitride layer 38 having a tensile stress is formed. Consequently, a lattice strain is applied to the channel regions to increase the mobility of carriers. For example, a silicon oxide layer is formed to a thickness of 10 nm as an etching stopper over the entire surface, and further a silicon nitride layer having a tensile stress is formed to a thickness of 50 nm over the entire surface. A resist is applied, and the resist is patterned by lithography so as to remain in the NMOS active region. The silicon nitride layer 37 having a tensile stress in the PMOS active region is etched by a dry process using the resist as a mask. The resist is removed by ashing or the like. Subsequently, a silicon oxide layer is formed to a thickness of 10 nm as an etching stopper, and further a silicon nitride layer having a compressive stress is formed to a thickness of 50 nm over the entire surface. A resist is applied, and the resist is patterned by lithography so as to leave the resist in the PMOS active region. The silicon nitride layer 38 having a compressive stress in the NMOS active region is etched by a dry process using the resist as a mask. The resist is removed by ashing or the like.

Turning to FIG. 24C, the silicon nitride layers 37 and 38 are covered with a silicon oxide layer 39. The silicon oxide layer 39 is, for example, formed to a thickness of about 600 nm at a temperature of 400° C. by plasma CVD.

The silicon oxide layer 39 is planarized by, for example, CMP, as illustrated in FIG. 25A.

The silicon oxide layer 39 and the silicon nitride layers 37 and 38 are subjected to lithography and dry etching to form connection holes 40a in which the surfaces of the respective fully silicided gate electrodes 36a and 36b are partially exposed, and connection holes 40b and 40c in which the surfaces of the (NiPt)Si layers 32b of the source/drain regions 24a and 24b are partially exposed, as illustrated in FIG. 25B. In this dry etching step, the silicon nitride layers 37 and 38 function appropriately as etching stoppers to suppress unexpected over-etching of the fully silicided gate electrodes 36a and 36b and the (NiPt)Si layers 32b of the source/drain regions 24a and 24b.

Turning to FIG. 25C, an underlayer coating 41 and then a W layer 42 are formed. The W layer 42 fills the connection holes 40a, 40b and 40c with the underlay coating 41 coating the hole surfaces. More specifically, the underlayer coating 41 is formed so as to cover the inner walls of the connection holes 40a, 40b and 40c by, for example, depositing Ti and TiN to thicknesses of about 10 nm and about 50 nm, respectively, on the silicon oxide layer 39 by sputtering. The W layer 42 may be formed to a thickness of about 300 nm so as to fill the connection holes 40a, 40b and 40c by, for example, CVD.

Figure 26A:
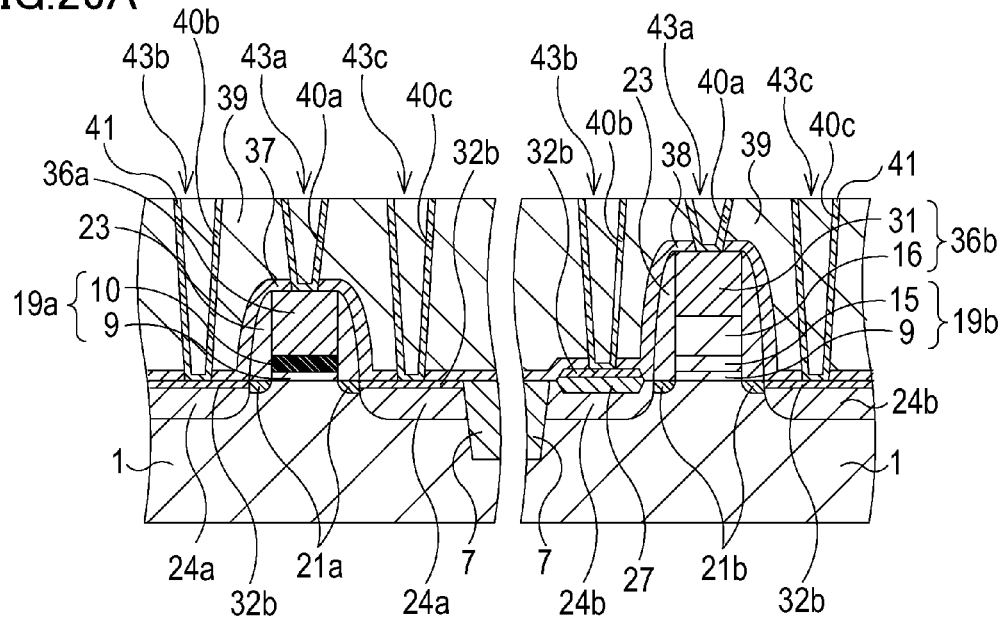

Connection plugs 43a, 43b and 43c are formed, as illustrated in FIG. 26A, which are formed by filling the connection holes 40a, 40b and 40c with the W layer 42 with the underlayer coating 41 coating the hole surfaces. More specifically, the W layer 42 is polished to planarize by, for example, CMP until the surface of the silicon oxide layer 39 is exposed. The connection holes 40a, 40b and 40c are thus filled with the W layer 42 with the underlayer coating 41 coating the hole surfaces by the planarization, thus forming the connection plugs 43a, 43b and 43c.

Figure 26B:
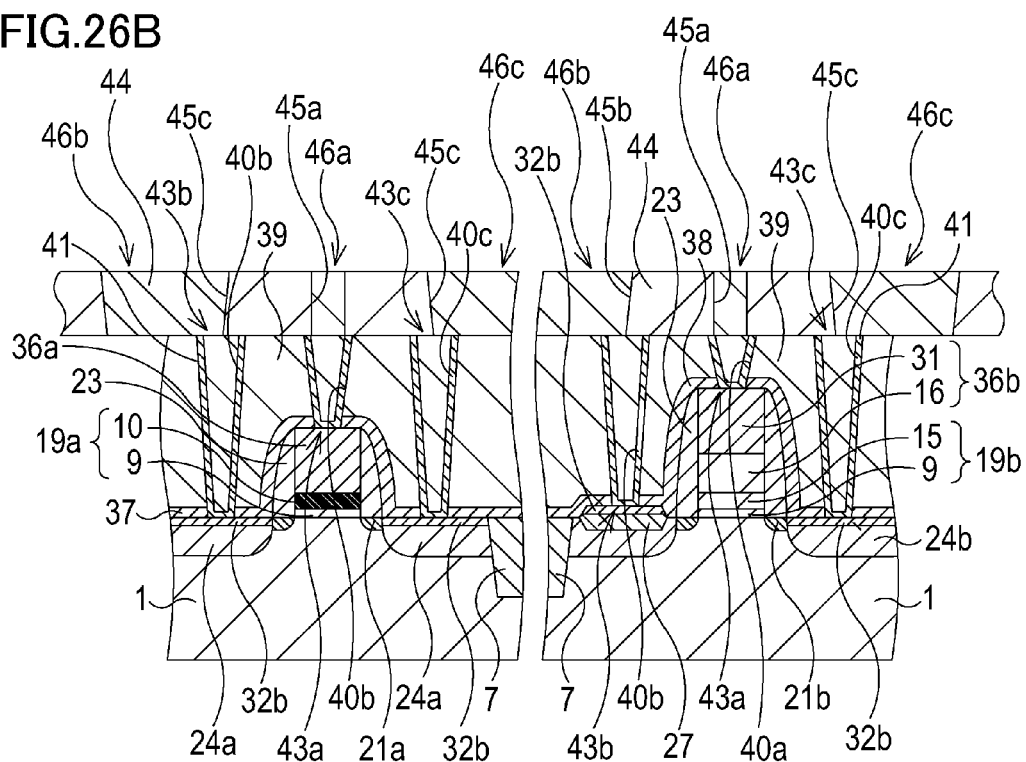

Turning to FIG. 26B, an insulating interlayer 44 and conductors 46a, 46b and 46c are formed. More specifically, an insulating material, such as silicon oxide, is deposited on the silicon oxide layer 39 to cover the upper surfaces of the connection plugs 43a, 43b and 43c by, for example, CVD, thus forming the insulating interlayer 44. Subsequently, a so-called damascene method is performed. In the present embodiment, a single damascene method is applied. The insulating interlayer 44 is subjected to lithography and dry etching to form wiring groves 45a, 45b and 45c therein. Subsequently, for example, Ta is deposited to form an underlayer coating 46 covering the inner walls of the wiring grooves 45a, 45b and 45c, and then, for example, Cu or a Cu alloy (not illustrated) is deposited on the underlayer coating 46 to fill the wiring grooves 45a, 45b and 45c by, for example, plating. Then, the Cu or Cu apply is polished to planarize by, for example, CMP until the surface of the insulating interlayer 44 is exposed. The wiring grooves 45a, 45b and 45c are filled with the Cu or Cu alloy, and are thus respectively connected to the connection plugs 43a, 43b and 43c to form conductors 46a, 46b and 46c.

Figure 27:
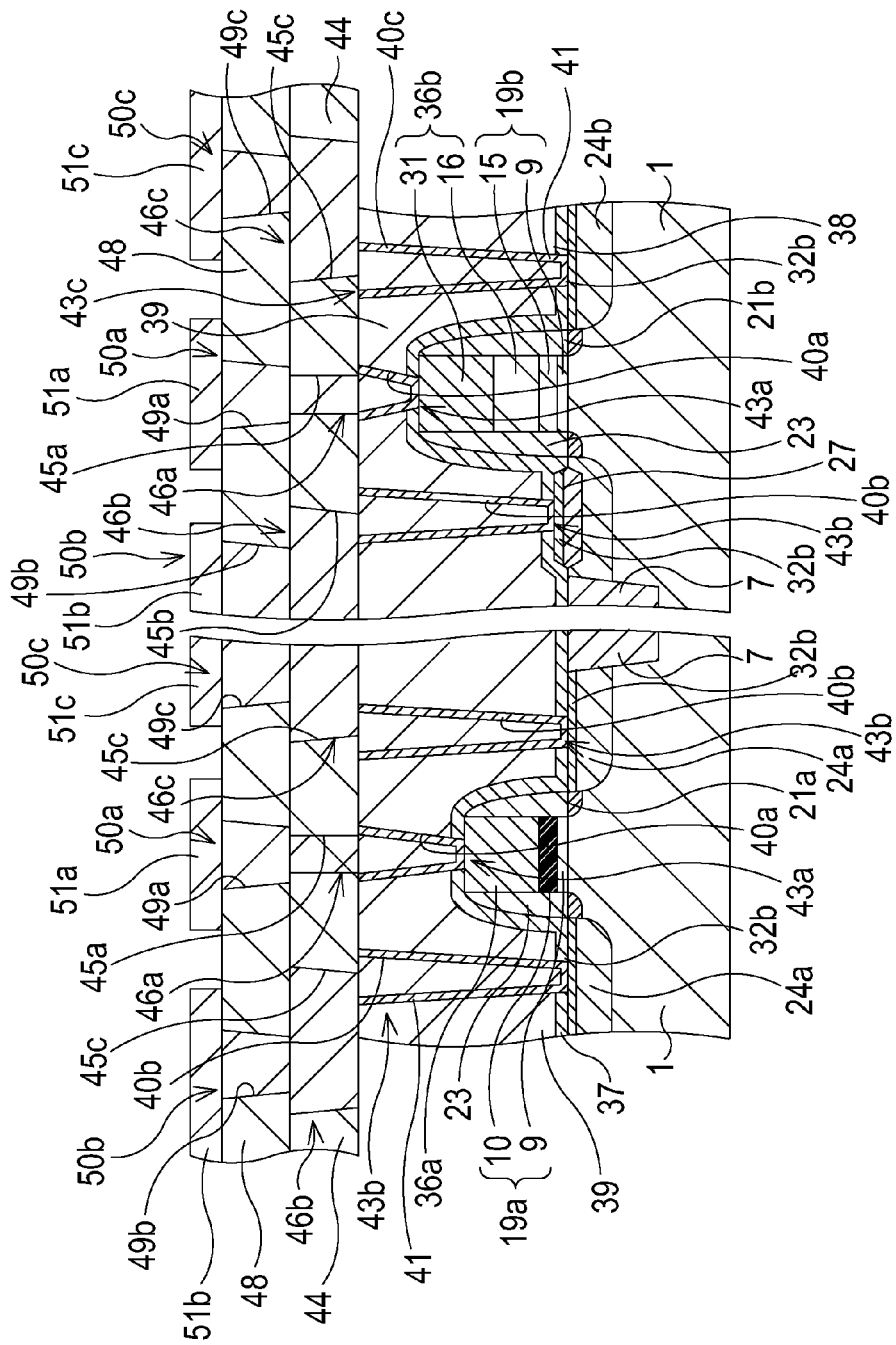

Turning to FIG. 27, after an insulating interlayer 48 is formed, via holes 49a, 49b and 49c are formed in the insulating interlayer 48 thorough the same procedure as described with reference to FIG. 26B. The inner walls of the via holes 49a, 49b and 49c are covered with a Ta underlayer coating (not illustrated), and the via holes 49a, 49b and 49c are filled with Cu or a Cu alloy to form via portions 50a, 50b and 50c connecting with the conductors 46a, 46b and 46c. Other conductors 51a, 51b and 51c are formed of, for example, Al or an Al alloy so as to extend on the insulating interlayer 48 and connect with the via portions 50a, 50b and 50c.

Other members (not illustrated) including an insulating interlayer, upper wiring and a protective layer are formed. After the second flash lamp annealing performed as msec annealing, a series of steps may be performed which includes removing an undesired naturally oxidized film; forming a Ni alloy layer or the like to cover the semiconductor substrate 1; annealing the semiconductor substrate 1; removing the unreacted Ni alloy layer; and performing flash lamp annealing as msec annealing. This series of steps may be repeated until a more sufficiently fully silicided gate electrode is formed. In the series of steps, flash lamp annealing may not be required in some cases.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that various changes, substitutions, and alterations could be made hereto without departing from the spirit and scope of the invention.

What is claimed is:

1. A method of manufacturing a semiconductor device, comprising:
    forming a gate electrode including silicon over a semiconductor substrate;
    forming a source region and a drain region in the semiconductor substrate;
    forming a first metal layer over the gate electrode, the source region and the drain region;
    forming silicide layers respectively in the gate electrode, the source region and the drain region by performing first annealing to heat the first metal layer;
    removing a remainder of the first metal layer after the first annealing;
    performing a second annealing after removing the first metal layer;
    forming a second metal layer to cover the gate electrode, the source region and the drain region after the second annealing;
    performing a third annealing to heat the second metal layer; and
    removing a remainder of the second metal layer after the third annealing.

2. The method according to claim 1, wherein the second annealing is performed by flash lamp annealing or laser annealing.

3. The method according to claim 2, wherein the flash lamp annealing is performed at an irradiation energy in the range of 24 J/cm$^2$ to 28 J/cm$^2$ at an assist temperature of in the range of 300° C. to 450° C. for an irradiation time in the range of 0.5 ms to 1.5 ms.

4. The method according to claim 2, wherein the laser annealing is performed at a temperature in the range of 700° C. to 1000° C.

5. The method according to claim 1, wherein the third annealing is performed at a temperature in the range of 200° C. to 450° C.

6. The method according to claim 1, further comprising performing a fourth annealing after removing the remainder of the second metal layer.

7. The method according to claim 6, wherein the fourth annealing is performed by flash lamp annealing or laser annealing.

8. The method according to claim 1, wherein the first metal layer includes Ni or a Ni alloy.

9. The method according to claim 1, wherein the second metal layer includes Ni or a Ni alloy.

10. The method according to claim 8, wherein the Ni alloy includes at least one element selected from the group consisting of Pt, Ta, W, Re, Y, Yb, La, Al, and Ti.

11. The method according to claim 10, wherein the Ni alloy includes at least one element at a concentration in the range of 2 at. % to 10 at. % each.

* * * * *